(12) United States Patent
Ceniceroz et al.

(10) Patent No.: US 12,087,123 B2
(45) Date of Patent: *Sep. 10, 2024

(54) SYSTEM AND METHOD FOR PROVIDING AWARDS BASED ON DYNAMIC REELS

(71) Applicant: IGT, Las Vegas, NV (US)

(72) Inventors: David Ceniceroz, Reno, NV (US); Julianne Rodgers, Reno, NV (US)

(73) Assignee: IGT, Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/323,145

(22) Filed: May 24, 2023

(65) Prior Publication Data

US 2023/0306811 A1    Sep. 28, 2023

Related U.S. Application Data

(63) Continuation of application No. 17/747,643, filed on May 18, 2022, now Pat. No. 11,699,323, which is a continuation of application No. 17/120,008, filed on Dec. 11, 2020, now Pat. No. 11,348,402, which is a continuation of application No. 16/265,133, filed on Feb. 1, 2019, now Pat. No. 10,867,469.

(51) Int. Cl.
*G07F 17/32*     (2006.01)
*G07F 17/34*     (2006.01)
*G09G 3/20*      (2006.01)

(52) U.S. Cl.
CPC ...... *G07F 17/3213* (2013.01); *G07F 17/3218* (2013.01); *G07F 17/3225* (2013.01); *G07F 17/3244* (2013.01); *G07F 17/3267* (2013.01); *G07F 17/34* (2013.01); *G09G 3/2074* (2013.01); *G09G 2300/0452* (2013.01); *G09G 2320/0233* (2013.01)

(58) Field of Classification Search
None
See application file for complete search history.

(56) References Cited

U.S. PATENT DOCUMENTS

| | | |
|---|---|---|
| 8,602,868 B2 | 12/2013 | Johnson et al. |
| 8,616,953 B2 | 12/2013 | Yi |
| 8,795,059 B2 | 8/2014 | Aoki et al. |
| 9,652,933 B2 | 5/2017 | Johnson et al. |
| 2005/0055113 A1 | 3/2005 | Gauselmann |
| 2005/0075159 A1 | 4/2005 | Kaminkow et al. |
| 2005/0159208 A1 | 7/2005 | Pacey |
| 2006/0025198 A1 | 2/2006 | Gail et al. |
| 2006/0247002 A1 | 11/2006 | Yoshimi et al. |
| 2008/0113696 A1 | 5/2008 | Owen et al. |
| 2010/0203948 A1 | 8/2010 | Falciglia |
| 2013/0065663 A1 | 3/2013 | Johnson et al. |
| 2016/0197615 A1 | 7/2016 | Oda |

*Primary Examiner* — Kevin Y Kim
(74) *Attorney, Agent, or Firm* — Neal, Gerber & Eisenberg LLP

(57) ABSTRACT

Systems and methods which provide a player zero, one or more awards based on a variable quantity of symbol display positions associated with one or more reels.

20 Claims, 11 Drawing Sheets

The growth of the fifth reel caused that reel to grow by another symbol to reach the bonus zone. This fifth reel reaching the bonus zone has triggered an unlimited free spins game which will not end until one of the free spins game reels reaches the free spins game termination zone. Good luck.

SYSTEM AND METHOD FOR PROVIDING AWARDS BASED ON DYNAMIC REELS

PRIORITY CLAIM

This application is a continuation of, claims the benefit of and priority to U.S. patent application Ser. No. 17/747,643, filed on May 18, 2022, which is a continuation of, claims the benefit of and priority to U.S. patent application Ser. No. 17/120,008, filed on Dec. 11, 2020, now U.S. Pat. No. 11,348,402, which is a continuation of, claims the benefit of and priority to U.S. patent application Ser. No. 16/265,133, filed on Feb. 1, 2019, now U.S. Pat. No. 10,867,469, the entire contents of which are each incorporated by reference herein.

BACKGROUND

Gaming machines may provide players awards in primary games. Gaming machines generally require the player to place a wager to activate the primary game. The award may be based on the player obtaining a winning symbol or symbol combination and on the amount of the wager.

BRIEF SUMMARY

In certain embodiments, the present disclosure relates to a gaming system including a processor, and a memory device which stores a plurality of instructions. When executed by the processor, the instructions cause the processor to cause a display, by a display device and for a first play of a game, of a first plurality of symbols at a first plurality of symbol display positions associated with a plurality of reels. When executed by the processor responsive to an occurrence of a symbol display position quantity modification event associated with a reel of the plurality of reels, the instructions cause the processor to modify a quantity of the symbol display positions associated with that reel. When executed by the processor responsive to the modified quantity of symbol display positions associated with that reel being a designated quantity of symbol display positions, the instructions cause the processor to trigger a secondary event associated with a position of a secondary event zone associated with that reel, and cause a display, by the display device, of the triggered secondary event. When executed by the processor responsive to the modified quantity of symbol display positions associated with that reel not being the designated quantity of symbol display positions, the instructions cause the processor to cause a display, by the display device and for a second play of the game, of a second plurality of symbols at a second plurality of symbol display positions associated with the plurality of reels, the second plurality of symbol display positions being based on the modified quantity of symbol display positions associated with that reel.

In certain embodiments, the present disclosure relates to a gaming system including a processor, and a memory device which stores a plurality of instructions. When executed by the processor responsive to an occurrence of a reel and secondary event zone display event, the instructions cause the processor to cause a display, by a display device, of a plurality of reels and a secondary event zone comprising a plurality of positions, wherein each of the positions of the secondary event zone is associated with one of the plurality of reels and each of the plurality of reels is associated with a first quantity of initially displayed symbol display positions and a first quantity of initially non-displayed symbol display positions. When executed by the processor responsive to a reel of the plurality of reels being subsequently associated with a second quantity of displayed symbol display positions, the instructions cause the processor to trigger a secondary event associated with the position of the secondary event zone associated with that reel, wherein the second quantity of displayed symbol display positions is equal to the first quantity of initially displayed symbol display positions and the first quantity of initially non-displayed symbol display positions.

In certain embodiments, the present disclosure relates to a method of operating a gaming system including displaying, by a display device and for a first play of a game, a first plurality of symbols at a first plurality of symbol display positions associated with a plurality of reels. Responsive to an occurrence of a symbol display position quantity modification event associated with a reel of the plurality of reels, the method includes modifying, by a processor, a quantity of the symbol display positions associated with that reel, and responsive to the modified quantity of symbol display positions associated with that reel being a designated quantity of symbol display positions, triggering, by the processor, a secondary event associated with a position of a secondary event zone associated with that reel, and displaying, by the display device, the triggered secondary event. Responsive to the modified quantity of symbol display positions associated with that reel not being the designated quantity of symbol display positions, the method includes displaying, by the display device and for a second play of the game, a second plurality of symbols at a second plurality of symbol display positions associated with the plurality of reels, the second plurality of symbol display positions being based on the modified quantity of symbol display positions associated with that reel.

Additional features are described herein, and will be apparent from the following Detailed Description and the figures.

DETAILED DESCRIPTION

Awards Based on Dynamic Reels

Figure 1A:
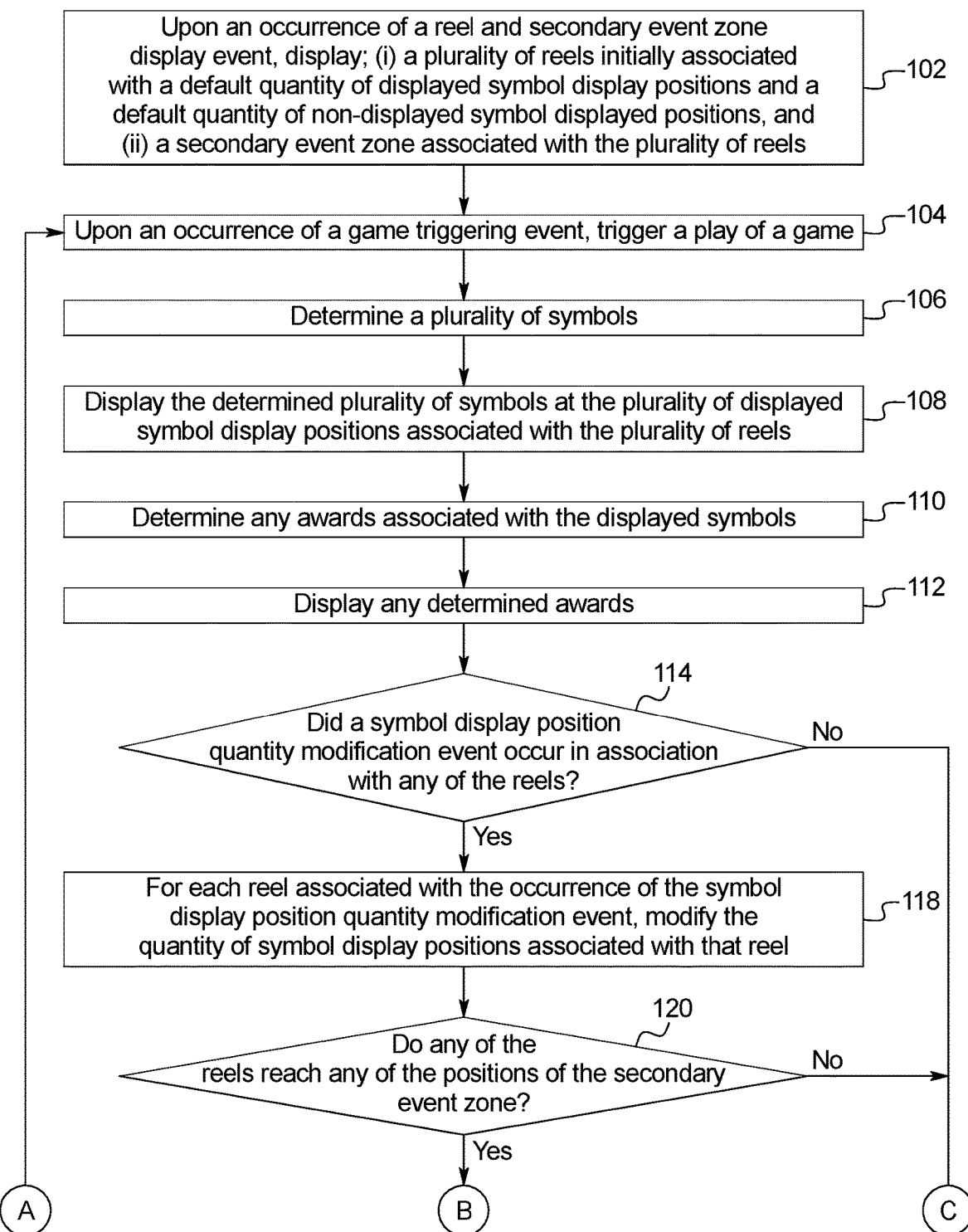
FIGS. 1A and 1B (collectively FIG. 1) are flow charts of an example process for operating a gaming system which provides zero, one or more awards based on the quantity of symbol display positions associated with one or more reels.

In various embodiments, the present disclosure relates generally to systems and methods which provide a player zero, one or more awards based on a variable quantity of symbol display positions associated with one or more reels.

In certain embodiments, the gaming system displays a plurality of reels initially associated with a default quantity of symbol display positions. The gaming system also displays a secondary event zone associated with the plurality of reels, wherein the secondary event zone is spaced apart from the initially displayed symbol display positions associated with the plurality of reels by a plurality of initially non-displayed symbol display positions also associated with the plurality of reels. The secondary event zone includes a plurality of positions associated with a plurality of different secondary events, such as additional awards or triggers of additional games. Each position of the secondary event zone is associated with one or more of the plurality of reels.

In operation of these embodiments, upon a game triggering event, the gaming system randomly generates a plurality of symbols at the plurality of displayed symbol display positions associated with the plurality of reels. In addition to displaying the plurality of symbols at the displayed symbol display positions associated with the reels, upon an occurrence of a symbol display position quantity modification event associated with a reel, such as the generation of a designated symbol on one of the reels, the gaming system modifies the quantity of symbol display positions associated with one or more of the reels. In one such embodiment, the occurrence of a symbol display position quantity modification event results in the gaming system adding one or more symbol display positions in association with one or more reels. In this embodiment, the gaming systems adds a symbol display position associated with a reel by displaying or otherwise revealing an initially non-displayed symbol display position associated with that reel. In another such embodiment, the occurrence of a symbol display position quantity modification event results in the gaming system removing one or more symbol display positions in association with one or more reels. In this embodiment, the gaming systems removes or otherwise hides a symbol display position associated with a reel by ceasing to display that symbol display position associated with that reel.

Following any modification of the quantity of symbol display positions associated with any of the reels, the gaming system determines if a secondary event zone triggering event has occurred in association with any of the reels. In certain embodiments, the gaming system determines if any of the reels have grown in size, via the adding of associated symbol display positions, to reach the secondary event zone, and more specifically to reach a position of the secondary event zone associated with that reel. That is, the gaming system determines if any reels have expanded by a quantity of displayed symbol display positions such that the position of the secondary event zone associated with a reel is no longer spaced apart from that reel (by one or more non-initially displayed symbol display positions).

In these embodiments, if the gaming system determines that a secondary event zone triggering event has occurred in association with a reel, the gaming system triggers the secondary event associated with the position of the secondary event zone associated with that reel. For example, if the first position of the secondary event zone associated with a first reel is associated with an unlimited free spins game and through a series of one or more symbol display position quantity modification events, the first reel has expanded in size (through the addition of displayed symbol display positions associated with that first reel) to reach the first position of the secondary event zone, the gaming system triggers a play of the unlimited free spins game. In this example, the unlimited free spins game proceeds with a plurality of reels each initially associated with a default quantity of symbol display positions wherein symbol display positions are added and/or removed from being associated with the reels until one of the reels reaches a termination zone.

On the other hand, if the gaming system determines that no secondary event zone triggering event has occurred in association with a reel, the gaming system causes the quantity of symbol display positions currently associated with that reel to persist until a reel reset event occurs. In these embodiments, following the occurrence of a symbol display position quantity modification event which adds one or more displayed symbol display positions to a reel, even if that reel has not reached an associated position of the secondary event zone, the gaming system retains such added displayed symbol display positions for another occurrence of a symbol display position quantity modification event and another opportunity to cause a secondary event zone triggering event to occur. Such a persistence feature provides that a player's gaming experience builds upon itself to further engage the player (or other players that happen to take over a prior player's position regarding the state of one or more expanded reels). Moreover, since the gaming system displays symbols at each displayed symbol display position, the persistence feature provides that even if a player does not trigger a secondary event associated with a position of the secondary event zone, one or more subsequent games will have a greater quantity of symbols generated, via the persistently expanded reel, and thus a greater quantity of award opportunities.

While certain embodiments described below are directed to a primary game, such as a reel game including a plurality of reels associated with variable quantities of symbol display positions, it should be appreciated that such embodiments may additionally or alternatively be employed in association with a secondary game, such as a bonus game including a plurality of reels associated with variable quantities of symbol display positions. Additionally, while the player's credit balance, the player's wager, and any awards are displayed as an amount of monetary credits or currency in certain of the embodiments described below, one or more of such player's credit balance, such player's wager, and any awards provided to such a player may be for non-monetary credits, promotional credits, and/or player tracking points or credits.

While certain embodiments described below are directed to varying the quantity of symbol display positions associated with zero, one or more reels, it should be appreciated that such variance may additionally or alternatively be employed in association with other game elements, such as varying the quantity of playing card positions which display playing cards, varying the quantity of keno number positions which display keno numbers or varying the quantity of bingo card positions which display bingo numbers. Furthermore, the term "EGM" is used herein to refer to any suitable electronic gaming machine which enables a player to play one or more games, wherein the EGM comprises, but is not limited to: a slot machine, a video poker machine, a video lottery terminal, a terminal associated with an electronic table game, a video keno machine, a video bingo machine located on a casino floor, a sports betting terminal, or a kiosk, such as a sports betting kiosk.

Figure 1B:
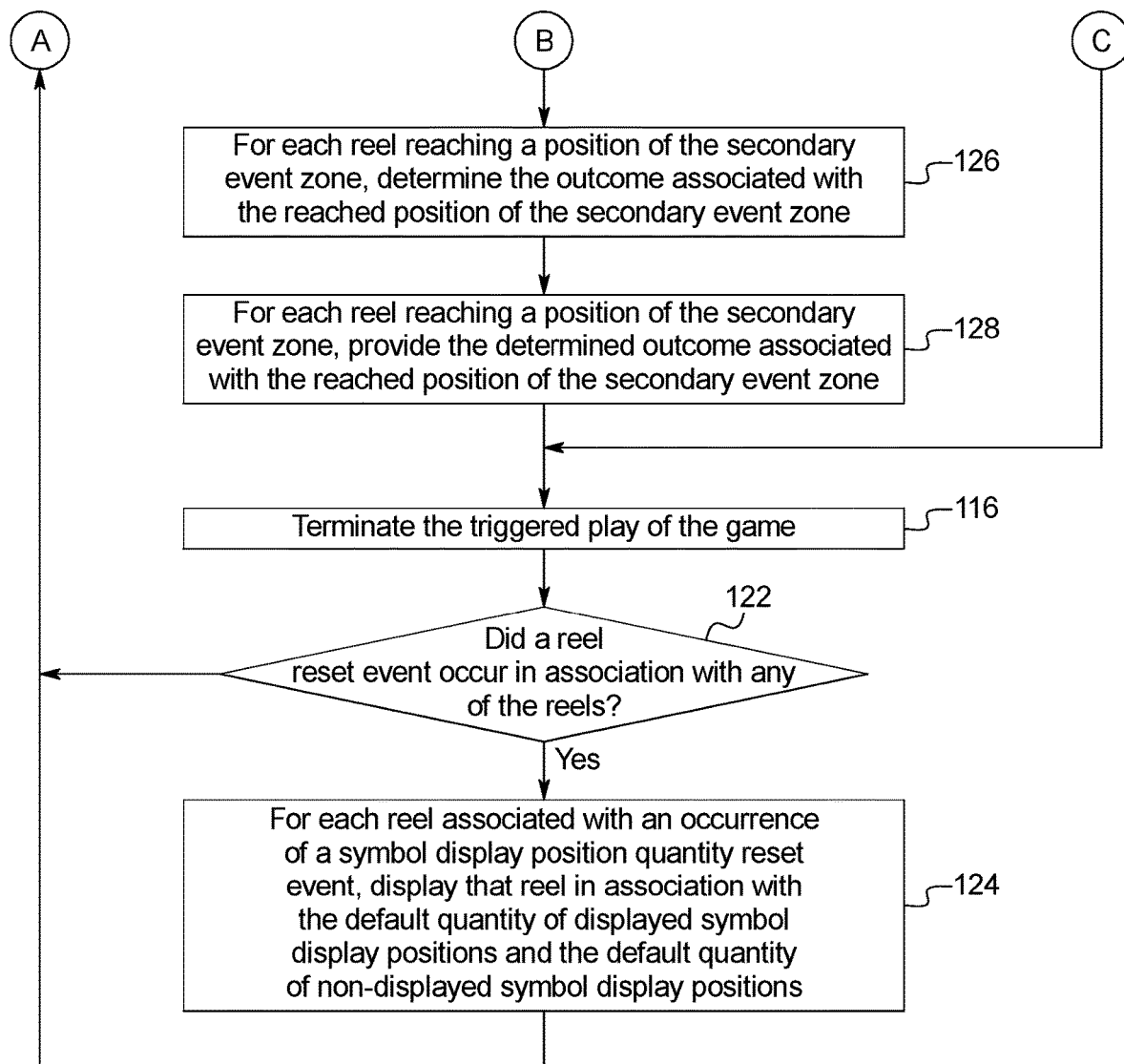

FIG. 1 is a flowchart of an example process or method of operating the gaming system of the present disclosure. In various embodiments, the process is represented by a set of instructions stored in one or more memories and executed by one or more processors. Although the process is described with reference to the flowchart shown in FIG. 1, many other processes of performing the acts associated with this illustrated process may be employed. For example, the order of certain of the illustrated blocks or diamonds may be changed, certain of the illustrated blocks or diamonds may be optional, or certain of the illustrated blocks or diamonds may not be employed.

Figure 2A:
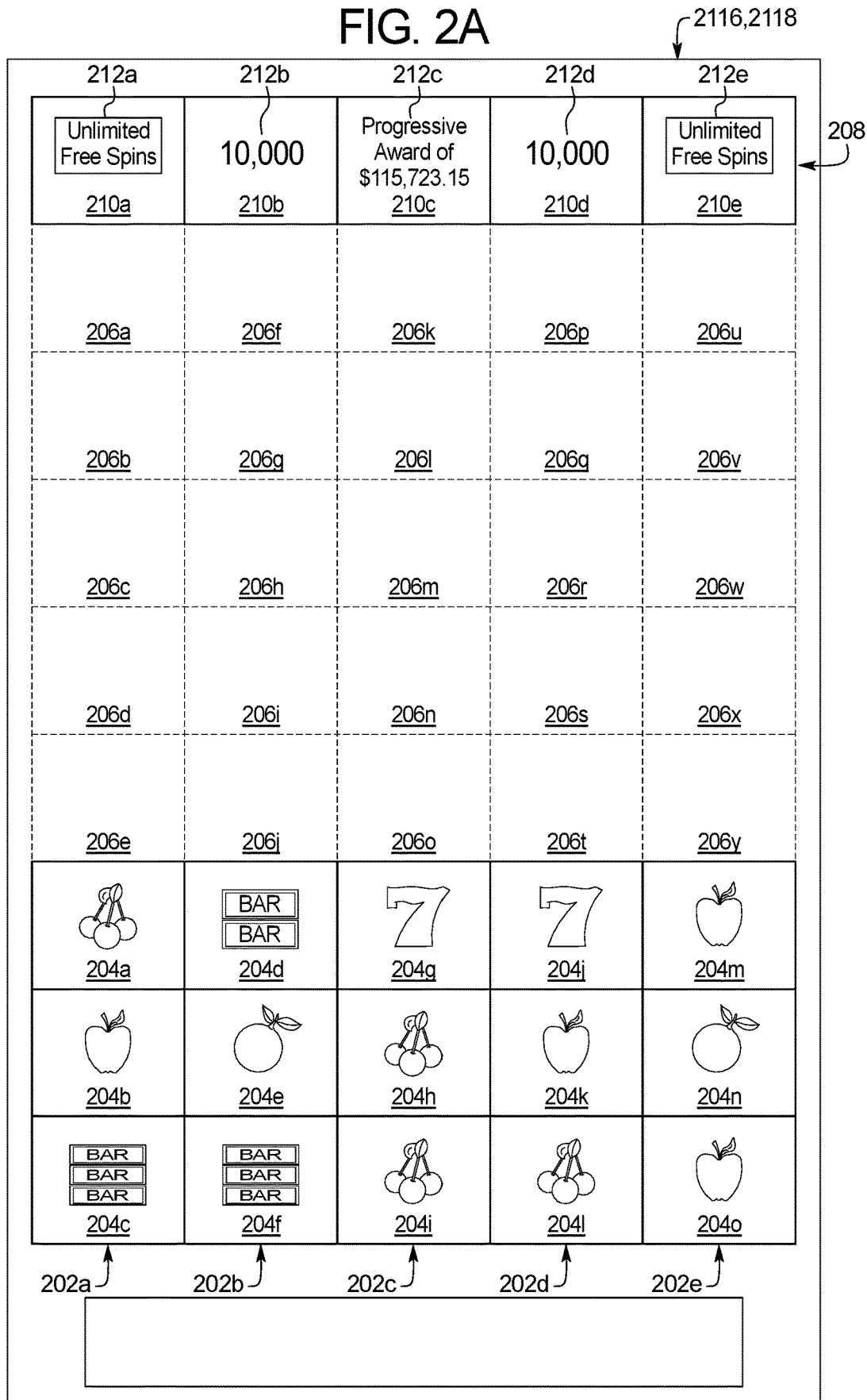
FIGS. 2A, 2B, 2C, 2D and 2E are front views of one embodiment of the gaming system disclosed herein illustrating the triggering of a secondary event based on the quantity of symbol display positions associated with one or more reels.

In different embodiments, upon an occurrence of a reel and secondary event zone display event, as indicated in block 102 of FIG. 1, the gaming system displays a plurality of reels initially associated with a default quantity of displayed symbol display positions and a default quantity of non-displayed symbol display positions. For example, as seen in FIG. 2A, the gaming system displays a plurality of reels 202a to 202e associated with a plurality of initially displayed symbol display positions 204a to 204o and a plurality of initially non-displayed symbol display positions 206a to 206y. In this example, each reel is associated with a default quantity of three initially displayed symbol display positions and a default quantity of five initially non-displayed symbol display positions. It should be appreciated that while initially displayed as a 3×5 symbol display position matrix with five initially non-displayed symbol display positions per reel, any suitable configuration of initially displayed symbol display positions and initially non-displayed symbol display positions may be utilized.

In addition to displaying the plurality of reels, upon the occurrence of the reel and secondary event zone display event, as also indicated in block 102, the gaming system display a secondary event zone associated with the plurality of reels. The secondary event zone includes a plurality of positions associated with a plurality of different secondary event zone outcomes, wherein each position of the secondary event zone is associated with at least one of the plurality of reels. In these embodiments, the gaming system displays the secondary event zone as spaced apart from the initially displayed symbol display positions associated with the plurality of reels, wherein for each reel, the default quantity of non-displayed symbol display positions associated with that reel occupies the space between the secondary event zone and the symbol display position associated with that reel displayed closest to the secondary event zone. For example, as seen in FIG. 2A, the gaming system displays a secondary event zone 208 including a plurality of positions 210a to 210e that each display a secondary event zone outcome 212a to 212e, such as a triggering of a secondary game 212a, a static award of ten-thousand credits 212b or an incrementing progressive ward 212c. It should be appreciated that while this illustrated example displays the secondary event zone above the reels, any suitable way of displaying the secondary event zone relative to the plurality of symbol display positions of the reels may be employed in association with the present disclosure. For example, a play of a primary game includes displaying the secondary event zone above the reels while a play of a secondary game includes displaying the secondary event zone below the reels.

In certain embodiments, the reel and secondary event zone display event occurs based on an event independent of any displayed event associated with any play of any game. In one such embodiment, the reel and secondary event zone display event occurs upon a suitable power-up event of the gaming system. In this embodiment, in conjunction with the gaming system otherwise being placed in a state or condition to accept wagers on the plays of the primary game, the gaming system displays the secondary event zone and the plurality of reels associated with a default quantity of symbol display positions. In another such embodiment, the reel and secondary event zone display event occurs upon a suitable card-in event of the gaming system. In this embodiment, upon the gaming system identifying a player in association with a player tracking system, the gaming system displays the secondary event zone and the plurality of reels associated with a default quantity of symbol display positions. In these embodiments, the gaming system displays to a player (or a passerby) the secondary event zone and the plurality of reels associated with a default quantity of symbol display positions prior to one or more plays of the game. In another embodiment, the reel and secondary event zone display event occurs based on a displayed event associated with a play of a game. In this embodiment, one play of a game results in the display to a player (or a passerby) of the secondary event zone and the plurality of reels associated with a default quantity of symbol display positions.

In addition to displaying the secondary event zone and the plurality of reels, upon an occurrence of a game triggering event, the gaming system triggers a play of a game as indicated in block 104 of FIG. 1.

In certain embodiments, the game comprises a play of a primary game, such as a primary wagering game, wherein the game triggering event includes the placement of a wager on the play of the primary game. In certain embodiments, the game comprises a play of a secondary game, such as a free spins game, wherein the game triggering event occurs based on a displayed event associated with a play of a primary game. In certain embodiments wherein the game comprises a secondary game, such as a free spins game, wherein the game triggering event occurs based on an event independent of any displayed event associated with the play of the primary game.

Figure 2B:
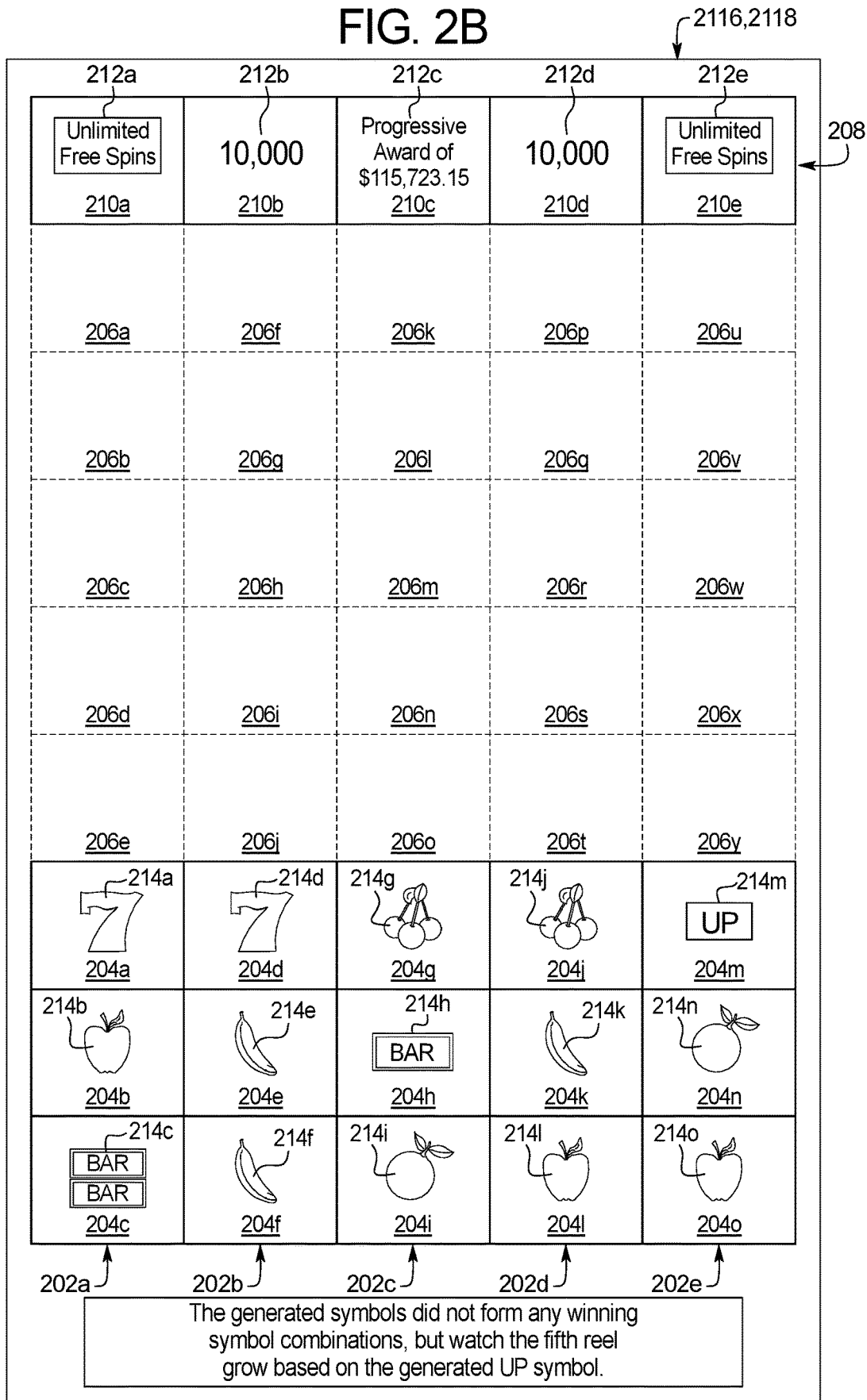

For the triggered play of the game, the gaming system determines and displays a plurality of symbols at the plurality of displayed symbol display positions associated with the plurality of reels as indicated in blocks 106 and 108 of FIG. 1. For example, as seen in FIG. 2B, for the triggered play of the game, the gaming system randomly determines a plurality of symbols 214a to 214o and displays such randomly determined symbols at the plurality of displayed symbol display positions 204a to 204o associated with the plurality of reels 202a to 202e. It should be appreciated that as the quantity of displayed symbol display positions associated with one or more reels fluctuates from play to play of a game, the quantity of symbols displayed at such symbol display positions (and thus the quantity of opportunities to form winning symbol combinations) also fluctuates from play to play of the game.

Following the determination and display of the plurality of symbols, the gaming system determines and displays any awards associated with the displayed symbols as indicated in blocks 110 and 112 of FIG. 1. For example, as seen in FIG. 2B, the gaming system determines that none of the displayed symbols formed any winning symbol combinations.

In addition to determining and displaying a plurality of symbols at the plurality of displayed symbol display positions associated with the plurality of reels, the gaming system determines if a symbol display position quantity modification event occurred in association with any of the reels as indicated in diamond 114 of FIG. 1. In certain embodiments, the symbol display position quantity modification event occurs based on a displayed event. For example, as seen in FIG. 2B, since displayed symbol display position 204m displayed a reel expansion symbol (e.g., the illustrated UP symbol 214m), the gaming system determines that a symbol display position quantity modification event occurred in association with reel 202c. In another embodiment, the symbol display position quantity modification event occurs based on an event independent of any displayed event.

Upon a determination that the symbol display position quantity modification event does not occur in association with any of the reels, the gaming system terminates the triggered play of the game as indicated in block 116. In this embodiment, since the quantity of symbol display positions associated with each of the reels is not modified for the triggered play of the game, none of the reels will reach the secondary event zone and no additional awards or additional award opportunities will be triggered, based on the size of the dynamic reels, in association with the play of the game.

On the other hand, if the symbol display position quantity modification event occurs in association with at least one of the reels, as indicated in block 118, for each reel associated with the occurrence of the symbol display position quantity modification event, the gaming system modifies the quantity of symbol display positions associated with that reel.

Figure 2C:
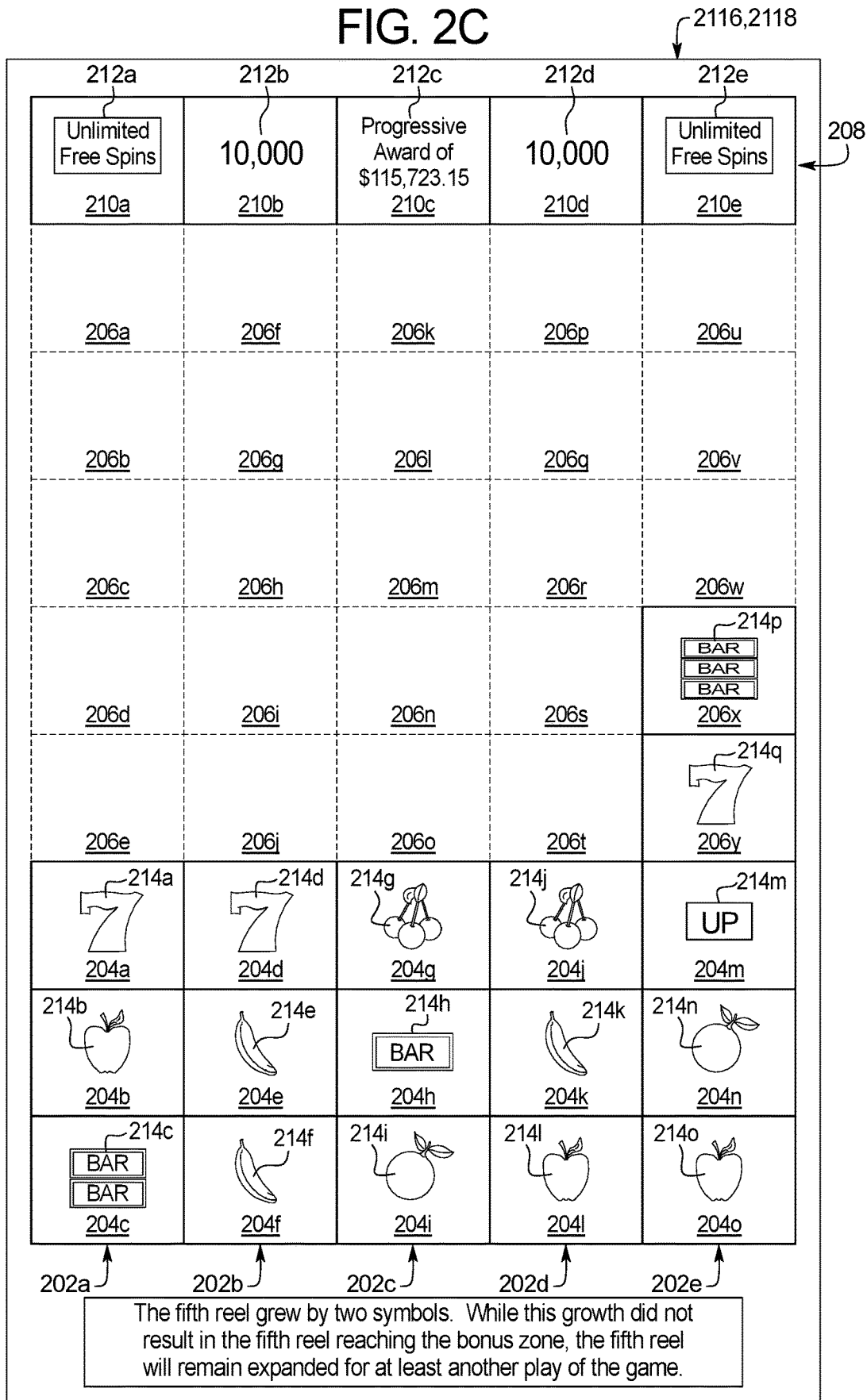

In one embodiment, for each reel associated with the occurrence of the symbol display position quantity modification event, the modification of the quantity of symbol display positions includes adding one or more symbol display positions in association with that reel. That is, the gaming system adds one or more symbol display positions in association with a reel such that the symbol display positions associated with that reel extend closer to the position of the secondary event zone associated with that reel. In one such embodiment, such a modification includes displaying one or more initially non-displayed symbol display positions associated with that reel. For example, as seen in FIG. 2C, following the display of the reel expansion symbol 214*m* at symbol display position 204*m* associated with reel 202*e*, the gaming system displays or otherwise activates previously non-displayed symbol display positions 206*x* and 206*y*. In this example, the display of a previously non-displayed symbol position includes the display of symbol 214*p* and 214*q* at now-displayed symbol display positions 206*x* and 206*y*, respectively.

In another embodiment, for each reel associated with the occurrence of the symbol display position quantity modification event, the modification of the quantity of symbol display positions includes removing one or more symbol display positions in association with that reel. That is, the gaming system removes one or more symbol display positions in association with a reel such that the symbol display positions associated with that reel extend further from the position of the secondary event zone associated with that reel. In one such embodiment, such a modification includes hiding or otherwise ceasing to display one or more displayed symbol display positions associated with that reel.

In certain embodiments, the gaming system randomly determines the quantity of symbol display positions added (or removed) in association with one or more reels. In certain embodiments, the gaming system determines the quantity of symbol display positions added (or removed) in association with one or more reels based on an amount of a wager placed. In certain embodiments, the gaming system determines the quantity of symbol display positions added (or removed) in association with one or more reels based on the status of the player.

Following the modification of the quantity of symbol display positions associated with one or more of the reels, the gaming system determines if any of the reels reach any of the positions of the secondary event zone as indicated in diamond 120 of FIG. 1. That is, for each reel, the gaming system determines if a secondary event zone triggering event occurs for that reel based on whether or not a designated quantity of symbol display positions have been added in association with that reel. In these embodiments, since the secondary event zone is spaced apart from the initially displayed symbol display positions associated with the plurality of reels, a secondary event zone triggering event occurs in association with a reel if each of the initial quantity of non-displayed symbol display positions associated with that reel (which occupy the space between the secondary event zone and the symbol display position associated with that reel displayed closest to the secondary event zone) have been subsequently displayed and thus the gaming system displays the reel extending to the secondary event zone.

If the gaming system determined that none of the reels reach any of the positions of the secondary event zone, the gaming system terminates the triggered play of the game as indicated in block 116. For example, as seen in FIG. 2C after displaying two previously hidden symbol display positions 206*x* and 206*y* associated with reel 202*e*, the gaming system determines that reel 202*e* has not expanded enough to reach associated position 210*e* of the secondary event zone 208.

In addition to terminating the play of the game, the gaming system determines if a reel reset event occurred in association with any of the reels as indicated in diamond 122 of FIG. 1. In certain embodiments, the reel reset event occurs based on a displayed event. In one such embodiment, as described in more detail below, a reel reset event occurs based on one or more reels expanding in size (via the addition of symbol display positions) enough to reach a position of the secondary event zone. In another embodiment, the reel reset event occurs based on an event independent of any displayed event.

If the gaming system determines that a reel reset event occurred in association with at least one of the reels, for that reel, the gaming system displays that reel in association with the default quantity of displayed symbol display positions and the default quantity of non-displayed symbol display positions as indicated in block 124. That is, the gaming system removes or otherwise hides one or more previously displayed symbol display positions in association with that reel such that the now currently displayed symbol display positions associated with that reel extend further from the position of the secondary event zone associated with that reel.

In one such embodiment, a reel reset event occurs when a player changes a wager level of a play of a game. In this embodiment, if a reel is in an expanded state (i.e., one or more initially non-displayed symbol display positions associated with that reel are currently displayed) when a player ends his/her gaming session, that reel persists in the expanded state for another player whom plays the game at the same wager level, wherein if that player (or the other player) changes the wager level, the gaming system reverts back to the default quantity of displayed symbol display positions in associated with the changed to wager level. In different embodiments, different wager levels have the same or different quantities of initially displayed (and/or initially non-displayed) symbol display positions.

Following the occurrence of the reel reset event and the gaming system displaying one or more reels reverting to a default configuration of being associated with a default quantity of displayed symbol display positions and a default quantity of non-displayed symbol display positions, the gaming system returns to block 104 to await another occurrence of the game triggering event. Alternatively, if the gaming system determines that a reel reset event did not occur in association with at least one of the reels, for that reel, the gaming system returns to block 104 to await another occurrence of the game initiation event. In this situation, the gaming system determining not to reset any of the quantity of symbol display positions associated with any of the reels results in one or more reels being displayed in an expanded state over multiple plays of a game. Such a configuration provides that once a reel has been expanded via adding one or more symbol display positions associated with that reel, that reel remains or persists in an expanded state for additional plays of the game until a reel reset event occurs. This persistence element provides that a player's gaming experience builds upon itself to further engage the player (or other players that happen to take over a prior player's position regarding the state of one or more expanded reels). Moreover, since the gaming system displays symbols at each displayed symbol display position, the persistence feature provides that even if a player does not trigger an event associated with a position of the secondary event zone, one or more subsequent games will have a greater quantity of symbols generated, via the persistently expanded reel, and thus a greater quantity of award opportunities.

Figure 2D:
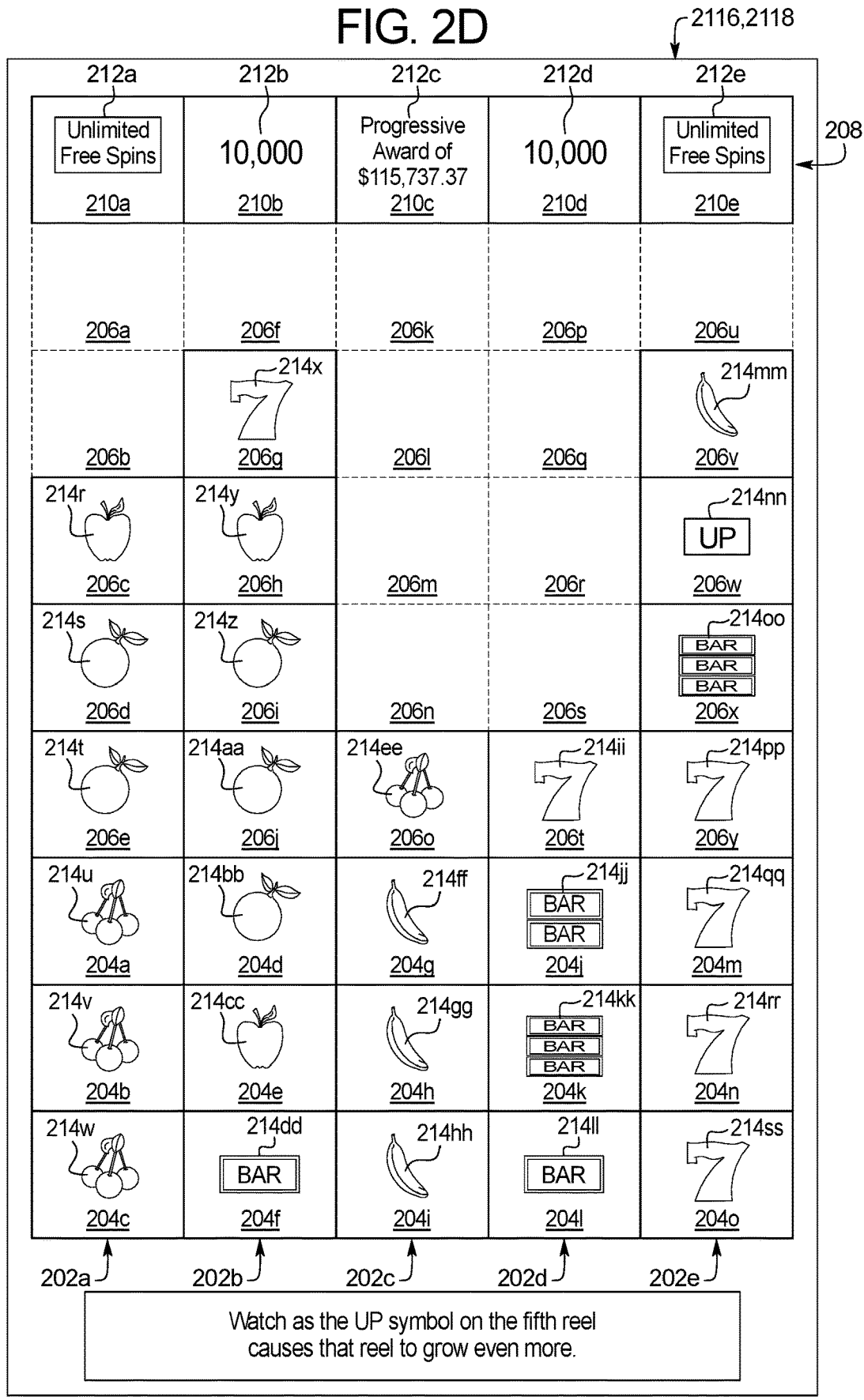
Figure 2E:
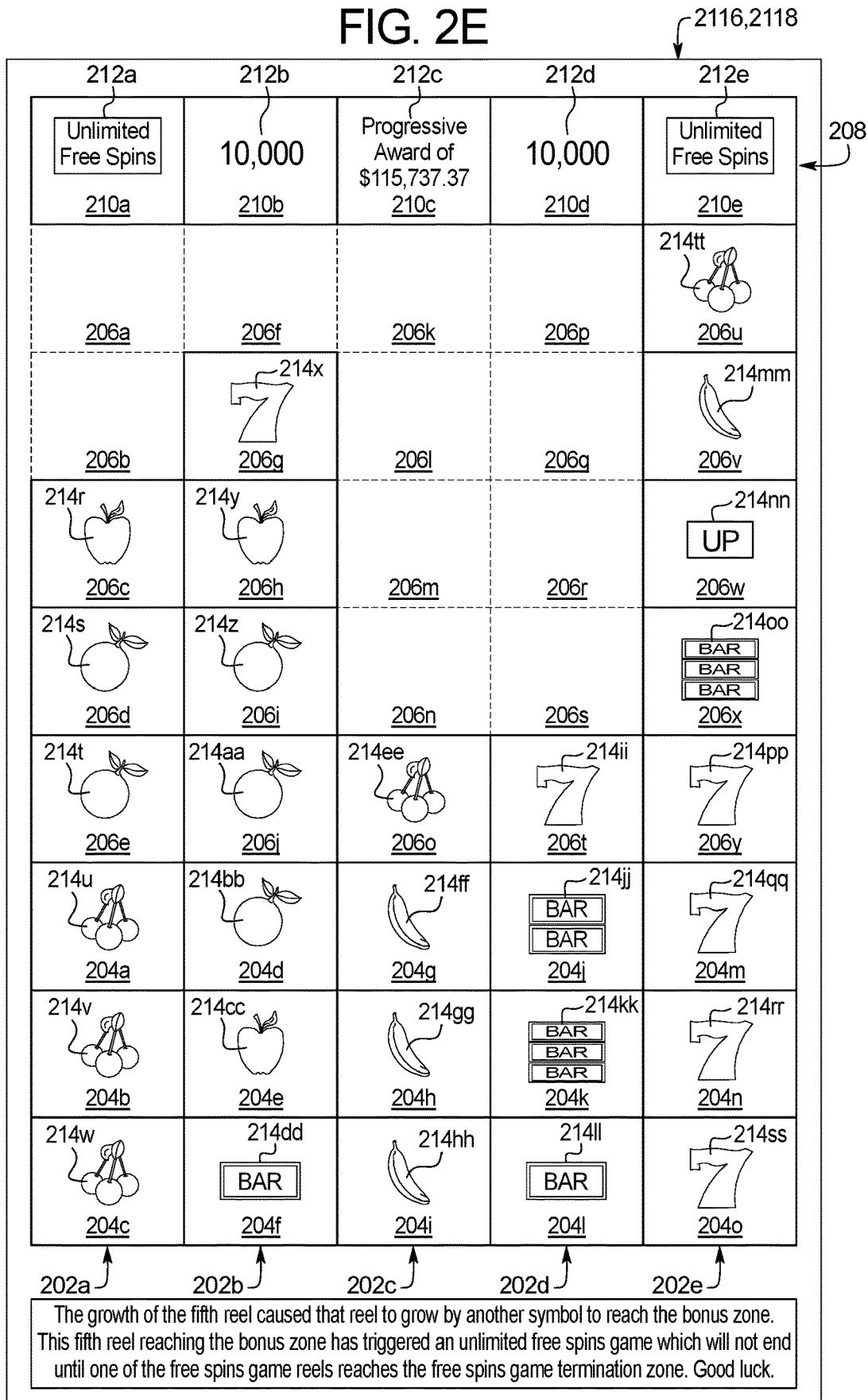

Returning to the determination of if any of the reels reach any of the positions of the secondary event zone of diamond 120 of FIG. 1, if the gaming system determined that at least one of the reels reaches at least one of the positions of the secondary event zone, for each of such reels, the gaming system determines the outcome associated with the reached position of the secondary event zone and causes the determined outcome to be provided as indicated in blocks 126 and 128 of FIG. 1. In this embodiment, following the modification of the quantity of symbol display positions associated with one or more of the reels, if at least one of such expanded reels caused a triggering event to occur in association with the secondary event zone, the gaming system proceeds to provide the outcome associated with the position of the secondary event zone associated with that expanded reel. For example, as seen in FIG. 2D, after a series of additional plays of the game occur (without any resetting of the quantity of symbol display positions of any of the reels) and after adding various symbol display positions to various reels, upon the occurrence of another reel expansion symbol 214OO at now displayed symbol display position 206w associated with reel 202e, the gaming system displays or otherwise activates previously non-displayed symbol display position 206u (as seen in FIG. 2E). In this example, the gaming system then determines that the addition of symbol display position 206u to reel 202e results in reel 202e expanding enough to reach the position 210e associated with outcome 212e of secondary event zone 208. In this example, the gaming system proceeds to trigger a play of an unlimited free spins game associated with the reached position of the secondary event zone.

Following providing the outcome associated with the position of the secondary event zone associated with the reel which has expanded enough to reach the secondary event zone, the gaming system terminates the triggered play of the game as indicated in block 116 and determines if a reel reset event occurred in association with any of the reels as described above. In one such embodiment, a reel reaching the secondary event zone corresponds with the occurrence of a reel reset event such that the reel then reverts to the default quantity of initially displayed symbol display positions and the default quantity of initially non-displayed symbol display positions. In another such embodiment, a reel reaching the secondary event zone corresponds with the occurrence of a reel reset event such that all of the reels then revert to the default quantity of initially displayed symbol display positions and the default quantity of initially non-displayed symbol display positions.

In certain embodiments, the outcome associated with a position of the secondary event zone includes a plurality of plays of a free spins game. In one such embodiment, the free spins game is an unlimited free spins game. In this embodiment, the reels revert back to the default quantity of initially displayed and initially non-displayed symbol display positions and the unlimited free spins game continues until one or more of the reels reach one or more of the positions of the secondary event zone. As such, the secondary event zone of the unlimited free spins game is a free spins game termination zone wherein one or more positions result in the termination of the unlimited free spins game (and zero, one or more positions result in the retriggering of the unlimited free spins game; zero, one or more positions result in a reduction of the quantity of symbol display positions associated with one or more of the reels; and/or zero, one or more of the positions result in an award). As such, the goal of the unlimited free spins game is to continue obtaining awards from the free spins of the reels while avoiding one or more of the reels reaching one or more of the positions of the secondary event zone (which may terminate the play of the unlimited free spins game).

In one embodiment wherein the outcome associated with a position of the secondary event zone includes a play of an unlimited free spins game, the gaming system displays the secondary event zone below the plurality of reels, wherein the free spins game continues so long as none of the reels reach the secondary event zone. In this embodiment, upon an occurrence of a symbol display position quantity modification event, such as the generation of a down symbol on a reel, the gaming system adds one or more symbol display positions below that reel (i.e., to bring that reel closer to the secondary event zone). In another embodiment, in addition to employing symbol display position quantity modification events which grow the reels in a downward direction toward the potential termination of the unlimited free spins game, the gaming system employs certain symbol display position quantity modification events, such as the generation of an up symbol on a reel, which results in the gaming system removing one or more symbol display positions from a reel (i.e., to bring that reel further away from the secondary event zone and extend the play of the unlimited free spins game). In these embodiments, upon any of the reels adding enough symbol display positions below such reels such that a reel reaches the secondary event zone of the unlimited free spins game, the gaming system provides the award of the position of the secondary event zone associated with that reel (and possibly terminates the play of the unlimited free spins game if that reached position is associated with a termination outcome).

In different embodiments, the outcome associated with a position of the secondary event zone includes one or more plays of any suitable game wherein such games include, but are not limited to: a play of any suitable wheel game; a play of any suitable card game; a play of any suitable offer and acceptance game; a play of any suitable award ladder game; a play of any suitable puzzle-type game; a play of any suitable persistence game; a play of any suitable selection game; a play of any suitable cascading symbols game; a play of any suitable ways to win game; a play of any suitable scatter pay game; a play of any suitable coin-pusher game; a play of any suitable elimination game; a play of any suitable stacked wilds game; a play of any suitable trail game; a play of any suitable bingo game; a play of any suitable video scratch-off game; a play of any suitable pick-until-complete game; a play of any suitable shooting simulation game; a play of any suitable racing game; a play of any suitable promotional game; a play of any suitable high-low game; a play of any suitable lottery game; a play of any suitable number selection game; a play of any suitable dice game; a play of any suitable skill game; a play of any suitable auction game; a play of any suitable reverse-auction game; and/or a play of any suitable group game.

In certain embodiments, zero, one or more of the outcomes of the secondary event zone are associated with an award, such as a monetary award or a non-monetary award. In certain embodiments, zero, one or more of the outcomes of the secondary event zone are associated with a game modifying attribute, such as a modifier. In one such embodiment, different outcomes of the secondary event zone are associated with different game modifying attributes. For example, one outcome of the secondary event zone is associated with a game modifying attribute of five additional free spins and another game outcome of the secondary event zone is associated with a game modifying attribute of a two wild reels. In one such embodiment, different outcomes of the secondary event zone are associated with the same game modifying attribute. In another such embodiment, different outcomes of the secondary event zone are associated with different quantities of game modifying attributes. In one such embodiment, different outcomes of the secondary event zone are associated with the same quantity of game modifying attributes.

In various embodiments, the gaming system activates one or more features in association with one or more outcomes of the secondary event zone. In different embodiments, such features include, but are not limited to: a feature which modifies one or more game outcomes of one or more plays of a game (e.g., the symbols evaluated for the play(s) of the game); a feature which modifies the paytable utilized for one or more plays of the game; a feature which modifies any award determined for one or more plays of the game; a feature which superimposed one or more symbols over the randomly generated symbols of the reels; a feature which replaces one or more symbols of the randomly generated symbols of the reels with a predetermined symbol pattern; a feature which replaces one or more symbols of the randomly generated symbols of the reels with a predetermined pattern of wild symbols; a book-end wild symbols feature; a stacked wild symbols feature; an expanding wild symbols feature; a nudging wild symbols feature; a retrigger symbol feature; an anti-terminator symbol feature; a locking reel feature, a locking symbol position feature; a feature which provides an additional award amount to a player; a feature modifying an amount of credits of a credit balance; a feature modifying an amount of promotional credits; a feature modifying a rate of earning player tracking points; a feature modifying a triggering event of a play of a secondary or bonus game; a feature modifying an activation of a secondary or bonus display (such as an award generator); a feature modifying a quantity of activations of a secondary or bonus display (e.g., a feature modifying a quantity of spins of an award generator); a feature modifying a quantity of sections of a secondary or bonus display (e.g., a feature modifying a quantity of sections of an award generator); a feature modifying one or more awards of a secondary or bonus display; a feature modifying an activation of a community award generator; a feature modifying a quantity of activations of a community award generator; a feature modifying a quantity of sections of a community award generator; a feature modifying one or more awards of a community award generator; a feature modifying a generated outcome (or a designated generated outcome) in a secondary game; a feature modifying a placed wager amount; a feature modifying a placed side wager amount; a feature modifying a number of wagered on paylines; a feature modifying a wager placed on one or more paylines (or on one or more designated paylines); a feature modifying a number of ways to win wagered on; a feature modifying a wager placed on one or more ways to win (or on one or more designated ways to win); a feature modifying an average expected payback percentage of a play of a game; a feature modifying an average expected payout of a play of a game; a feature modifying one or more awards available; a feature modifying a range of awards available; a feature modifying a type of awards available; a feature modifying one or more progressive awards; a feature modifying which progressive awards are available to be won; a feature modifying an activation of a reel (or a designated reel); a feature modifying an activation of a plurality of reels; a feature modifying a generated outcome (or a designated generated outcome) on a designated payline; a feature modifying a generated outcome (or a designated generated outcome) in a scatter configuration; a feature modifying a winning way to win (or a designated winning way to win); a feature modifying a designated symbol or symbol combination; a feature modifying a generation of a designated symbol or symbol combination on a designated payline; a feature modifying a generation of a designated symbol or symbol combination in a scatter configuration; a feature modifying a quantity of picks in a selection game; a feature modifying a quantity of offers in an offer and acceptance game; a feature modifying a quantity of moves in a trail game; a feature modifying an amount of free spins provided; a feature modifying a game terminating or ending condition; a feature modifying how one or more aspects of one or more games (e.g., colors, speeds, sound) are displayed to a player; and/or a feature modifying any game play feature associated with any play of any game disclosed herein.

In different embodiments, one or more awards provided in association with the secondary event zone (and/or one or more winning symbol combinations) include one or more of: a quantity of monetary credits, a quantity of non-monetary credits, a quantity of promotional credits, a quantity of player tracking points, a progressive award, a modifier, such as a multiplier, a quantity of free plays of one or more games, a quantity of plays of one or more secondary or bonus games, a multiplier of a quantity of free plays of a game, one or more lottery based awards, such as lottery or drawing tickets, a wager match for one or more plays of one or more games, an increase in the average expected payback percentage for one or more plays of one or more games, one or more comps, such as a free dinner, a free night's stay at a hotel, a high value product such as a free car, or a low value product, one or more bonus credits usable for online play, a lump sum of player tracking points or credits, a multiplier for player tracking points or credits, an increase in a membership or player tracking level, one or more coupons or promotions usable within and/or outside of the gaming establishment (e.g., a 20% off coupon for use at a convenience store), virtual goods associated with the gaming system, virtual goods not associated with the gaming system, an access code usable to unlock content on an internet.

In certain embodiments, as indicated in FIGS. 2A to 2E, each reel is associated with one position of the secondary event zone. In another embodiment, one or more reels are each reel associated with a plurality of positions of the secondary event zone. In another embodiment, one or more positions of the secondary event zone are each associated with a plurality of reels. In another embodiment, different wager levels which may be placed are associated with different quantities of positions of the secondary event zone and/or different outcomes associated with such positions of the secondary event zone. In another embodiment, different player tracking level statuses are associated with different quantities of positions of the secondary event zone and/or different outcomes associated with such positions of the secondary event zone.

In certain embodiments, as indicated in FIGS. 2A to 2E, each reel is associate with the same quantity of initially displayed symbol display positions and the same quantity of initially non-displayed symbol display positions. In another embodiment, two or more reels are each associated with different quantities of initially displayed symbol display positions. In another embodiment, two or more reels are each associated with different quantities of initially non-displayed symbol display positions. In another embodiment, two or more reels are each associated with different quantities of initially displayed symbol display positions and different quantities of initially non-displayed symbol display positions. In another embodiment, different wager levels which may be placed are associated with different quantities of initially displayed symbol display positions per reel and different quantities of initially non-displayed symbol display positions per reel. In another embodiment, different player tracking level statuses are associated with different quantities of initially displayed symbol display positions per reel and different quantities of initially non-displayed symbol display position per reel.

In certain embodiments, the gaming system determines whether to modify a quantity of symbol display positions associated with one or more reels based on at least one interaction with a player. In one such embodiment, the gaming system enables the player to make one or more skill-inputs to determine whether to modify a quantity of symbol display positions associated with one or more reels. In these embodiments, the one or more skill input includes one or more quantifiable inputs which tend to measure one or more aspects of the player's skill. In different embodiments, skill includes one or more of: (i) physical skill, such as, but not limited to: timing, aim, physical strength or any combination thereof which is quantifiable by zero, one or more inputs made by the player in association with the reel activation sequence; (ii) mental skill (i.e., knowledge, reasoning, and/or strategy) which is quantifiable by one or more inputs made by the player (or the lack of any inputs made by the player) in association with the reel activation sequence; and (iii) any other type of skill which is quantifiable by one or more inputs made by the player (or the lack of any inputs made by the player). In various embodiments, the player utilizes one or more skill input devices to make one or more quantifiable skill inputs. Examples of skill input devices include, but are not limited to: mobile devices, such as a personal gaming device (as described below), joysticks, buttons, a mouse or a plurality of mice, one or more trackballs, one or more pointing devices, one or more bodily motion trackers such as motion sensing devices for human-computer interaction, touchpads, touchscreens, one or more controllers with: (1) one or more motion sensing devices, (2) one or more proximity sensing devices, (3) one or more force sensing devices (transducers), (4) one or more accelerometers, or any other suitable skill input devices.

In one embodiment, the gaming system provides a group gaming aspect to the games disclosed herein. In one such embodiment, the modifications of a quantity of symbol display positions associated with one or more reels are employed in a community game wherein a plurality of players cooperate or play together to win zero, one or more awards. In another such embodiment, the modifications of a quantity of symbol display positions associated with one or more reels are employed in a competitive event wherein a plurality of players compete or play against each other to win zero, one or more awards.

In one embodiment, the gaming system causes at least one display device of the gaming system to display the game including the dynamically sized reels and the secondary event zone. In another embodiment, the gaming system additionally or alternatively causes one or more community or overhead display devices to display part or all of the game including the dynamically sized reels and the secondary event zone to one or more other players or bystanders either at a gaming establishment or viewing over a network, such as the internet. In another embodiment, the gaming system additionally or alternatively causes one or more internet sites to each display the game including the dynamically sized reels and the secondary event zone such that a player is enabled to log on from a personal web browser.

In different embodiments, a reel and secondary event zone display event, a game triggering event, a symbol display position quantity modification event, a reel reset event and/or a secondary event zone triggering event occurs based on an outcome associated with one or more plays of any primary games. In one embodiment, such determinations are symbol driven based on the generation of one or more designated symbols or symbol combinations. In various embodiments, a generation of a designated symbol (or sub-symbol) or a designated set of symbols (or sub-symbols) over one or more plays of a primary game causes such conditions to be satisfied and/or one or more of such events to occur.

In different embodiments, the gaming system does not provide any apparent reasons to the players for an occurrence of a reel and secondary event zone display event, a game triggering event, a symbol display position quantity modification event, a reel reset event and/or a secondary event zone triggering event. In these embodiments, such determinations are not triggered by an event in a primary game or based specifically on any of the plays of any primary games. That is, these events occur without any explanation or alternatively with simple explanations.

In one such embodiment, a reel and secondary event zone display event, a game triggering event, a symbol display position quantity modification event, a reel reset event and/or a secondary event zone triggering event occurs based on an amount of coin-in. In this embodiment, the gaming system determines if an amount of coin-in reaches or exceeds a designated amount of coin-in (i.e., a threshold coin-in amount). Upon the amount of coin-in wagered reaching or exceeding the threshold coin-in amount, the gaming system causes one or more of such events or conditions to occur. In another such embodiment, a reel and secondary event zone display event, a game triggering event, a symbol display position quantity modification event, a reel reset event and/or a secondary event zone triggering event occurs based on an amount of virtual currency-in. In this embodiment, the gaming system determines if an amount of virtual currency-in wagered reaches or exceeds a designated amount of virtual currency-in (i.e., a threshold virtual currency-in amount). Upon the amount of virtual currency-in wagered reaching or exceeding the threshold virtual currency-in amount, the gaming system causes one or more of such events or conditions to occur. In different embodiments, the threshold coin-in amount and/or the threshold virtual currency-in amount is predetermined, randomly determined, determined based on a player's status (such as determined through a player tracking system), determined based on a generated symbol or symbol combination, determined based on a random determination by the central controller, determined based on a random determination at the gaming device, determined based on one or more side wagers placed, determined based on the player's primary game wager, determined based on time (such as the time of day) or determined based on any other suitable method or criteria.

In one such embodiment, a reel and secondary event zone display event, a game triggering event, a symbol display position quantity modification event, a reel reset event and/or a secondary event zone triggering event occurs based on an amount of coin-out. In this embodiment, the gaming system determines if an amount of coin-out reaches or exceeds a designated amount of coin-out (i.e., a threshold coin-out amount). Upon the amount of coin-out reaching or exceeding the threshold coin-out amount, the gaming system causes one or more of such events or conditions to occur. In another such embodiment, a reel and secondary event zone display event, a game triggering event, a symbol display position quantity modification event, a reel reset event and/or a secondary event zone triggering event occurs based on an amount of virtual currency-out. In this embodiment, the gaming system determines if an amount of virtual currency-out reaches or exceeds a designated amount of virtual currency-out (i.e., a threshold virtual currency-out amount). Upon the amount of virtual currency-out reaching or exceeding the threshold virtual currency-out amount, the gaming system causes one or more of such events or conditions to occur. In different embodiments, the threshold coin-out amount and/or the threshold virtual currency-out amount is predetermined, randomly determined, determined based on a player's status (such as determined through a player tracking system), determined based on a generated symbol or symbol combination, determined based on a random determination by the central controller, determined based on a random determination at the gaming device, determined based on one or more side wagers placed, determined based on the player's primary game wager, determined based on time (such as the time of day) or determined based on any other suitable method or criteria.

In different embodiments, a reel and secondary event zone display event, a game triggering event, a symbol display position quantity modification event, a reel reset event and/or a secondary event zone triggering event occurs based on a predefined variable reaching a defined parameter threshold. For example, when the 500,000$^{th}$ player has played an electronic gaming machine ("EGM") (ascertained from a player tracking system), one or more of such events or conditions occur. In different embodiments, the predefined parameter thresholds include a length of time, a length of time after a certain dollar amount is hit, a wager level threshold for a specific device (which EGM is the first to contribute $250,000), a number of EGMs active, or any other parameter that defines a suitable threshold.

In different embodiments, a reel and secondary event zone display event, a game triggering event, a symbol display position quantity modification event, a reel reset event and/or a secondary event zone triggering event occurs based on a quantity of games played. In this embodiment, a quantity of games played is set for when one or more of such events or conditions will occur. In one embodiment, such a set quantity of games played is based on historic data.

In different embodiments, a reel and secondary event zone display event, a game triggering event, a symbol display position quantity modification event, a reel reset event and/or a secondary event zone triggering event occurs based on time. In this embodiment, a time is set for when one or more of such events or conditions will occur. In one embodiment, such a set time is based on historic data.

In different embodiments, a reel and secondary event zone display event, a game triggering event, a symbol display position quantity modification event, a reel reset event and/or a secondary event zone triggering event occurs based upon gaming system operator defined player eligibility parameters stored on a player tracking system (such as via a player tracking card or other suitable manner). In this embodiment, the parameters for eligibility are defined by the gaming system operator based on any suitable criterion. In one embodiment, the gaming system recognizes the player's identification (via the player tracking system) when the player inserts or otherwise associates their player tracking card in the EGM and/or logs into the player tracking system using a mobile device, such as a personal gaming device. The gaming system determines the player tracking level of the player and if the current player tracking level defined by the gaming system operator is eligible for one or more of such events or conditions. In one embodiment, the gaming system operator defines minimum bet levels required for such events or conditions to occur based on the player's card level.

In different embodiments, a reel and secondary event zone display event, a game triggering event, a symbol display position quantity modification event, a reel reset event and/or a secondary event zone triggering event occurs based on a system determination, including one or more random selections by the central controller. For example, as described above, the gaming system tracks all active EGMs and the wagers they placed, wherein based on the EGM's state as well as one or more wager pools associated with the EGM, the gaming system determines whether to one or more of such events or conditions will occur. In one such embodiment, the player who consistently places a higher wager is more likely to be associated with an occurrence of one or more of such events or conditions than a player who consistently places a minimum wager. It should be appreciated that the criteria for determining whether a player is in active status or inactive status for determining if one or more of such events occur may the same as, substantially the same as, or different than the criteria for determining whether a player is in active status or inactive status for another one of such events to occur.

In different embodiments, a reel and secondary event zone display event, a game triggering event, a symbol display position quantity modification event, a reel reset event and/or a secondary event zone triggering event occurs based on a determination of if any numbers allotted to an EGM match a randomly selected number. In this embodiment, upon or prior to each play of each EGM, an EGM selects a random number from a range of numbers and during each primary game, the EGM allocates the first N numbers in the range, where N is the number of credits bet by the player in that primary game. At the end of the primary game, the randomly selected number is compared with the numbers allocated to the player and if a match occurs, one or more of such events or conditions occur.

It should be appreciated that any suitable manner of causing a reel and secondary event zone display event, a game triggering event, a symbol display position quantity modification event, a reel reset event and/or a secondary event zone triggering event to occur may be implemented in accordance with the gaming system and method disclosed herein. It should be further appreciated that one or more of the above-described triggers pertaining to a reel and secondary event zone display event, a game triggering event, a symbol display position quantity modification event, a reel reset event and/or a secondary event zone triggering event occurring may be combined in one or more different embodiments.

Alternative Embodiments

It should be appreciated that in different embodiments, one or more of:
i. when a reel and secondary event zone display event, a game triggering event, a symbol display position quantity modification event, a reel reset event and/or a secondary event zone triggering event occurs;
ii. a quantity of default initially displayed symbol display positions associated with one or more reels;
iii. a quantity of default initially non-displayed symbol display positions associated with one or more reels;
iv. which outcomes are associated with which positions of the secondary event zone;
V. a quantity of reels to modify a quantity of associated symbol display positions of upon an occurrence of a symbol display position quantity modification event;
vi. which reels to modify a quantity of associated symbol display positions of upon an occurrence of a symbol display position quantity modification event;
vii. a quantity of symbol display positions to add in association with one or more reels upon an occurrence of a symbol display position quantity modification event;
viii. a quantity of symbol display positions to remove in association with one or more reels upon an occurrence of a symbol display position quantity modification event;
ix. a quantity of reels to reset upon an occurrence of a reel reset event;
X. which reels to reset upon an occurrence of a reel reset event; and/or
xi. any determination disclosed herein;
is/are predetermined, randomly determined, randomly determined based on one or more weighted percentages, determined based on a generated symbol or symbol combination, determined independent of a generated symbol or symbol combination, determined based on a random determination by the central controller, determined independent of a random determination by the central controller, determined based on a random determination at the gaming system, determined independent of a random determination at the gaming system, determined based on at least one play of at least one game, determined independent of at least one play of at least one game, determined based on a player's selection, determined independent of a player's selection, determined based on one or more side wagers placed, determined independent of one or more side wagers placed, determined based on the player's primary game wager, determined independent of the player's primary game wager, determined based on time (such as the time of day), determined independent of time (such as the time of day), determined based on an amount of coin-in accumulated in one or more pools, determined independent of an amount of coin-in accumulated in one or more pools, determined based on a status of the player (i.e., a player tracking status), determined independent of a status of the player (i.e., a player tracking status), determined based on one or more other determinations disclosed herein, determined independent of any other determination disclosed herein or determined based on any other suitable method or criteria.

Gaming Systems

The above-described embodiments of the present disclosure may be implemented in accordance with or in conjunction with one or more of a variety of different types of gaming systems, such as, but not limited to, those described below.

The present disclosure contemplates a variety of different gaming systems each having one or more of a plurality of different features, attributes, or characteristics. A "gaming system" as used herein refers to various configurations of: (a) one or more central servers, central controllers, or remote hosts; (b) one or more electronic gaming machines such as those located on a casino floor; and/or (c) one or more personal gaming devices, such as desktop computers, laptop computers, tablet computers or computing devices, personal digital assistants, mobile phones, and other mobile computing devices.

Thus, in various embodiments, the gaming system of the present disclosure includes: (a) one or more electronic gaming machines in combination with one or more central servers, central controllers, or remote hosts; (b) one or more personal gaming devices in combination with one or more central servers, central controllers, or remote hosts; (c) one or more personal gaming devices in combination with one or more electronic gaming machines; (d) one or more personal gaming devices, one or more electronic gaming machines, and one or more central servers, central controllers, or remote hosts in combination with one another; (e) a single electronic gaming machine; (f) a plurality of electronic gaming machines in combination with one another; (g) a single personal gaming device; (h) a plurality of personal gaming devices in combination with one another; (i) a single central server, central controller, or remote host; and/or (j) a plurality of central servers, central controllers, or remote hosts in combination with one another.

For brevity and clarity and unless specifically stated otherwise, "EGM" as used herein represents one EGM or a plurality of EGMs, "personal gaming device" as used herein represents one personal gaming device or a plurality of personal gaming devices, and "central server, central controller, or remote host" as used herein represents one central server, central controller, or remote host or a plurality of central servers, central controllers, or remote hosts.

As noted above, in various embodiments, the gaming system includes an EGM (or personal gaming device) in combination with a central server, central controller, or remote host. In such embodiments, the EGM (or personal gaming device) is configured to communicate with the central server, central controller, or remote host through a data network or remote communication link. In certain such embodiments, the EGM (or personal gaming device) is configured to communicate with another EGM (or personal gaming device) through the same data network or remote communication link or through a different data network or remote communication link. For example, the gaming system includes a plurality of EGMs that are each configured to communicate with a central server, central controller, or remote host through a data network.

In certain embodiments in which the gaming system includes an EGM (or personal gaming device) in combination with a central server, central controller, or remote host, the central server, central controller, or remote host is any suitable computing device (such as a server) that includes at least one processor and at least one memory device or data storage device. As further described herein, the EGM (or personal gaming device) includes at least one EGM (or personal gaming device) processor configured to transmit and receive data or signals representing events, messages, commands, or any other suitable information between the EGM (or personal gaming device) and the central server, central controller, or remote host. The at least one processor of that EGM (or personal gaming device) is configured to execute the events, messages, or commands represented by such data or signals in conjunction with the operation of the EGM (or personal gaming device). Moreover, the at least one processor of the central server, central controller, or remote host is configured to transmit and receive data or signals representing events, messages, commands, or any other suitable information between the central server, central controller, or remote host and the EGM (or personal gaming device). The at least one processor of the central server, central controller, or remote host is configured to execute the events, messages, or commands represented by such data or signals in conjunction with the operation of the central server, central controller, or remote host. One, more than one, or each of the functions of the central server, central controller, or remote host may be performed by the at least one processor of the EGM (or personal gaming device). Further, one, more than one, or each of the functions of the at least one processor of the EGM (or personal gaming device) may be performed by the at least one processor of the central server, central controller, or remote host.

In certain such embodiments, computerized instructions for controlling any games (such as any primary or base games and/or any secondary or bonus games) displayed by the EGM (or personal gaming device) are executed by the central server, central controller, or remote host. In such "thin client" embodiments, the central server, central controller, or remote host remotely controls any games (or other suitable interfaces) displayed by the EGM (or personal gaming device), and the EGM (or personal gaming device) is utilized to display such games (or suitable interfaces) and to receive one or more inputs or commands. In other such embodiments, computerized instructions for controlling any games displayed by the EGM (or personal gaming device) are communicated from the central server, central controller, or remote host to the EGM (or personal gaming device) and are stored in at least one memory device of the EGM (or personal gaming device). In such "thick client" embodiments, the at least one processor of the EGM (or personal gaming device) executes the computerized instructions to control any games (or other suitable interfaces) displayed by the EGM (or personal gaming device).

In various embodiments in which the gaming system includes a plurality of EGMs (or personal gaming devices), one or more of the EGMs (or personal gaming devices) are thin client EGMs (or personal gaming devices) and one or more of the EGMs (or personal gaming devices) are thick client EGMs (or personal gaming devices). In other embodiments in which the gaming system includes one or more EGMs (or personal gaming devices), certain functions of one or more of the EGMs (or personal gaming devices) are implemented in a thin client environment, and certain other functions of one or more of the EGMs (or personal gaming devices) are implemented in a thick client environment. In one such embodiment in which the gaming system includes an EGM (or personal gaming device) and a central server, central controller, or remote host, computerized instructions for controlling any primary or base games displayed by the EGM (or personal gaming device) are communicated from the central server, central controller, or remote host to the EGM (or personal gaming device) in a thick client configuration, and computerized instructions for controlling any secondary or bonus games or other functions displayed by the EGM (or personal gaming device) are executed by the central server, central controller, or remote host in a thin client configuration.

In certain embodiments in which the gaming system includes: (a) an EGM (or personal gaming device) configured to communicate with a central server, central controller, or remote host through a data network; and/or (b) a plurality of EGMs (or personal gaming devices) configured to communicate with one another through a data network, the data network is a local area network (LAN) in which the EGMs (or personal gaming devices) are located substantially proximate to one another and/or the central server, central controller, or remote host. In one example, the EGMs (or personal gaming devices) and the central server, central controller, or remote host are located in a gaming establishment or a portion of a gaming establishment.

In other embodiments in which the gaming system includes: (a) an EGM (or personal gaming device) configured to communicate with a central server, central controller, or remote host through a data network; and/or (b) a plurality of EGMs (or personal gaming devices) configured to communicate with one another through a data network, the data network is a wide area network (WAN) in which one or more of the EGMs (or personal gaming devices) are not necessarily located substantially proximate to another one of the EGMs (or personal gaming devices) and/or the central server, central controller, or remote host. For example, one or more of the EGMs (or personal gaming devices) are located: (a) in an area of a gaming establishment different from an area of the gaming establishment in which the central server, central controller, or remote host is located; or (b) in a gaming establishment different from the gaming establishment in which the central server, central controller, or remote host is located. In another example, the central server, central controller, or remote host is not located within a gaming establishment in which the EGMs (or personal gaming devices) are located. In certain embodiments in which the data network is a WAN, the gaming system includes a central server, central controller, or remote host and an EGM (or personal gaming device) each located in a different gaming establishment in a same geographic area, such as a same city or a same state. Gaming systems in which the data network is a WAN are substantially identical to gaming systems in which the data network is a LAN, though the quantity of EGMs (or personal gaming devices) in such gaming systems may vary relative to one another.

In further embodiments in which the gaming system includes: (a) an EGM (or personal gaming device) configured to communicate with a central server, central controller, or remote host through a data network; and/or (b) a plurality of EGMs (or personal gaming devices) configured to communicate with one another through a data network, the data network is an internet (such as the Internet) or an intranet. In certain such embodiments, an Internet browser of the EGM (or personal gaming device) is usable to access an Internet game page from any location where an Internet connection is available. In one such embodiment, after the EGM (or personal gaming device) accesses the Internet game page, the central server, central controller, or remote host identifies a player before enabling that player to place any wagers on any plays of any wagering games. In one example, the central server, central controller, or remote host identifies the player by requiring a player account of the player to be logged into via an input of a unique player name and password combination assigned to the player. The central server, central controller, or remote host may, however, identify the player in any other suitable manner, such as by validating a player tracking identification number associated with the player; by reading a player tracking card or other smart card inserted into a card reader (as described below); by validating a unique player identification number associated with the player by the central server, central controller, or remote host; or by identifying the EGM (or personal gaming device), such as by identifying the MAC address or the IP address of the Internet facilitator. In various embodiments, once the central server, central controller, or remote host identifies the player, the central server, central controller, or remote host enables placement of one or more wagers on one or more plays of one or more primary or base games and/or one or more secondary or bonus games, and displays those plays via the Internet browser of the EGM (or personal gaming device). Examples of implementations of Internet-based gaming are further described in U.S. Pat. No. 8,764,566, entitled "Internet Remote Game Server," and U.S. Pat. No. 8,147,334, entitled "Universal Game Server".

The central server, central controller, or remote host and the EGM (or personal gaming device) are configured to connect to the data network or remote communications link in any suitable manner. In various embodiments, such a connection is accomplished via: a conventional phone line or other data transmission line, a digital subscriber line (DSL), a T-1 line, a coaxial cable, a fiber optic cable, a wireless or wired routing device, a mobile communications network connection (such as a cellular network or mobile Internet network), or any other suitable medium. The expansion in the quantity of computing devices and the quantity and speed of Internet connections in recent years increases opportunities for players to use a variety of EGMs (or personal gaming devices) to play games from an ever-increasing quantity of remote sites. Additionally, the enhanced bandwidth of digital wireless communications may render such technology suitable for some or all communications, particularly if such communications are encrypted. Higher data transmission speeds may be useful for enhancing the sophistication and response of the display and interaction with players.

EGM Components

Figure 3:
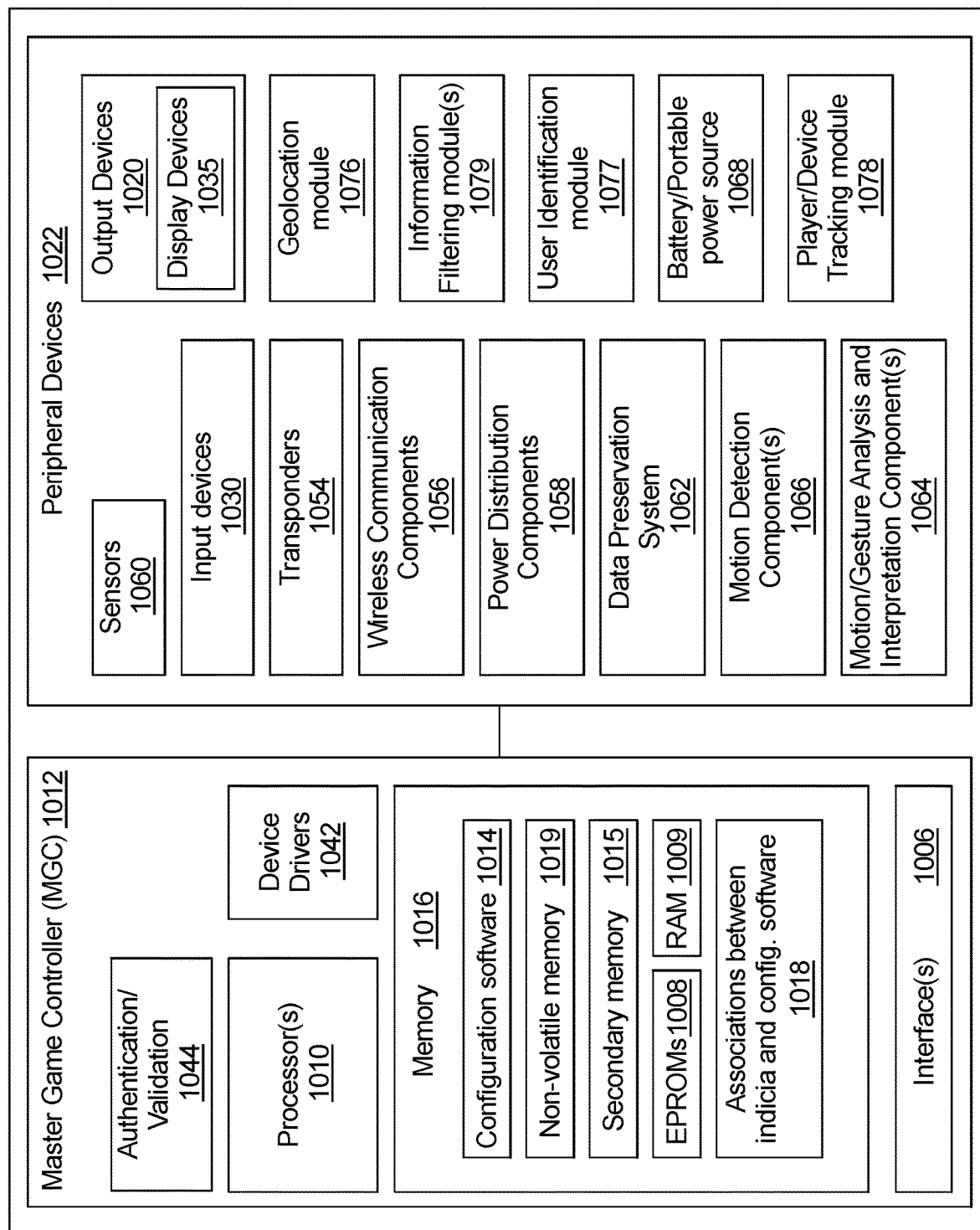
FIG. 3 is a schematic block diagram of one embodiment of an electronic configuration of an example gaming system disclosed herein.
Figure 4A:
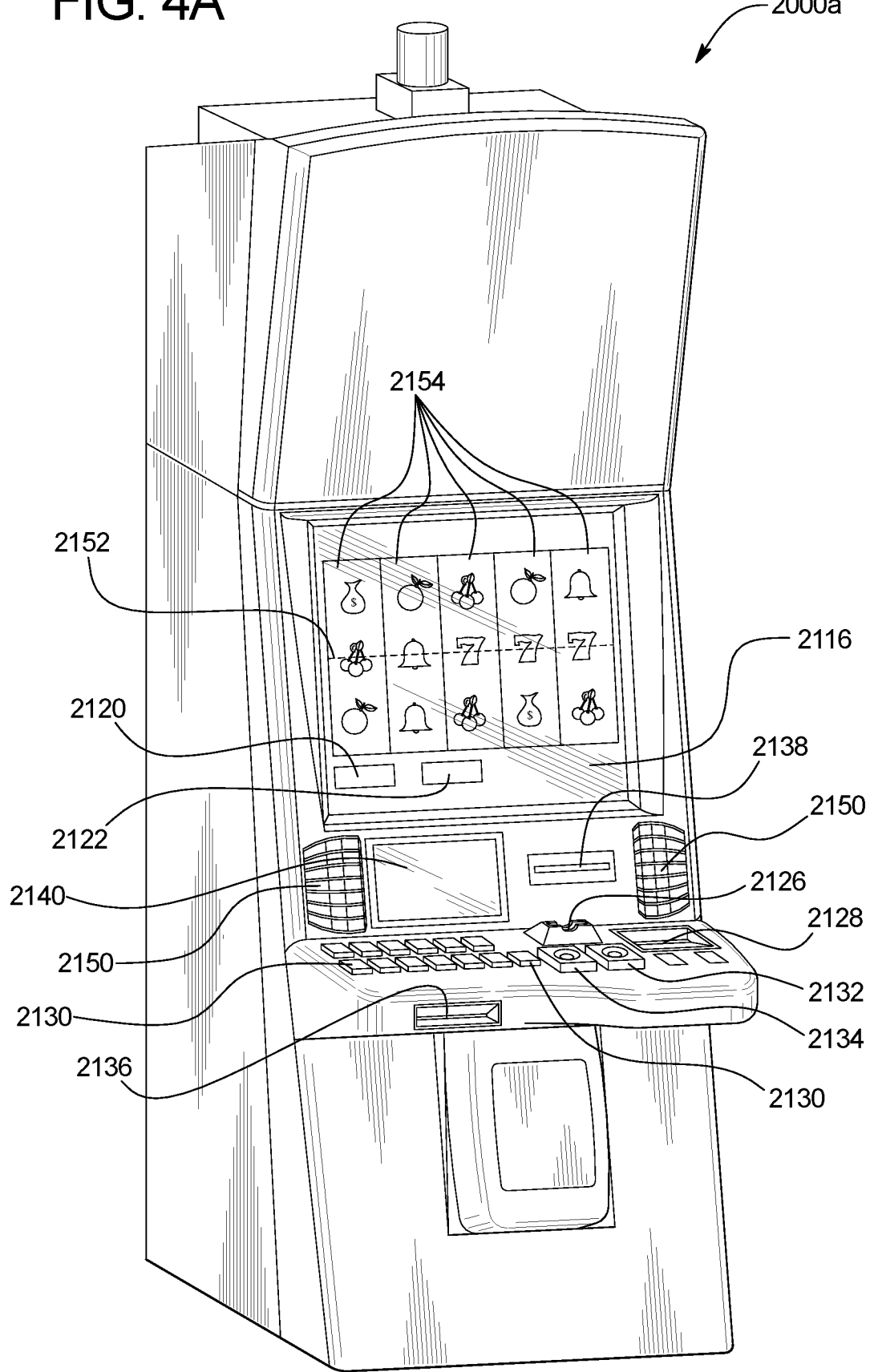
FIGS. 4A and 4B are perspective views of example alternative embodiments of the gaming system disclosed herein.
Figure 4B:
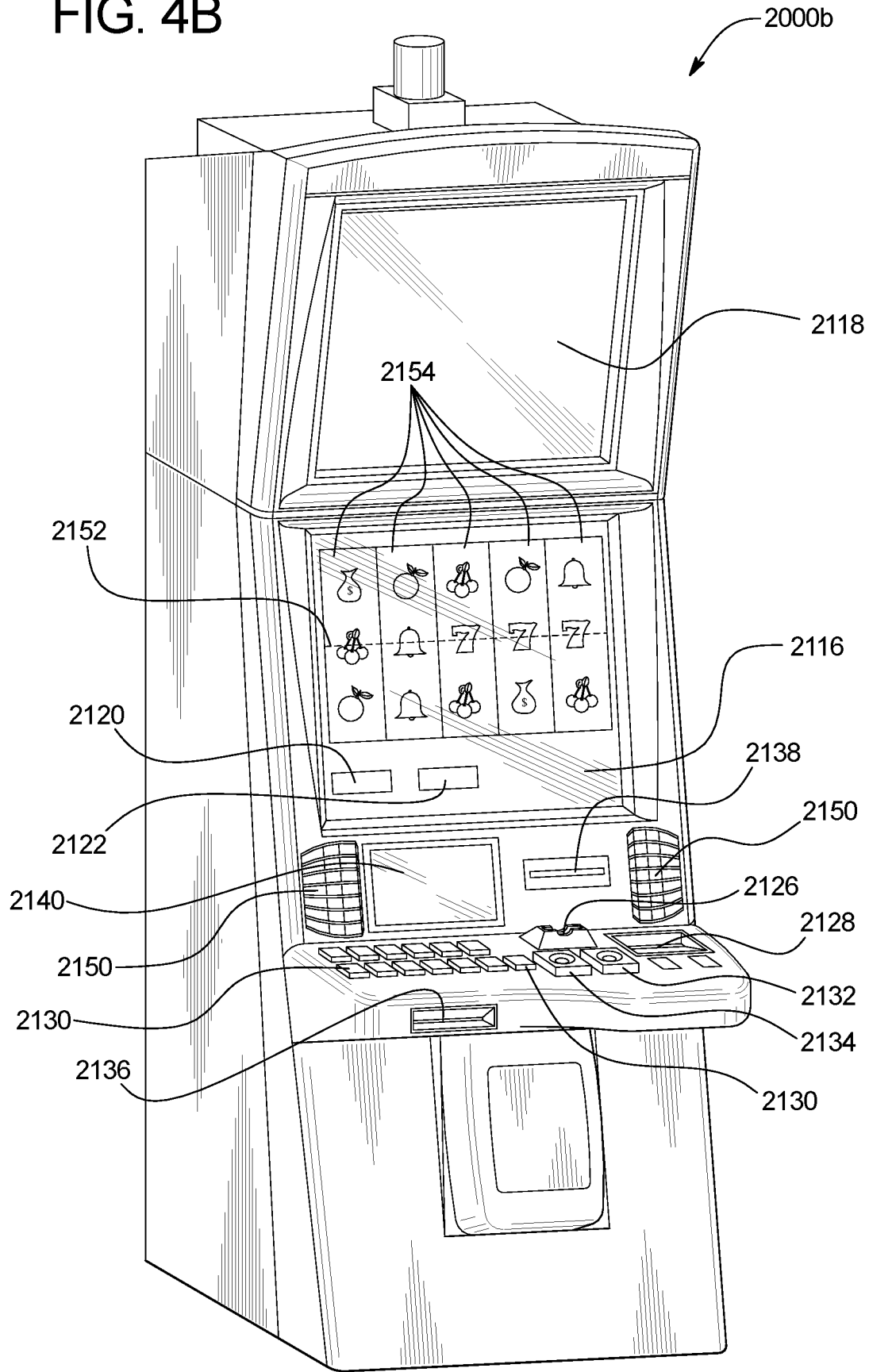
Figure 4C:
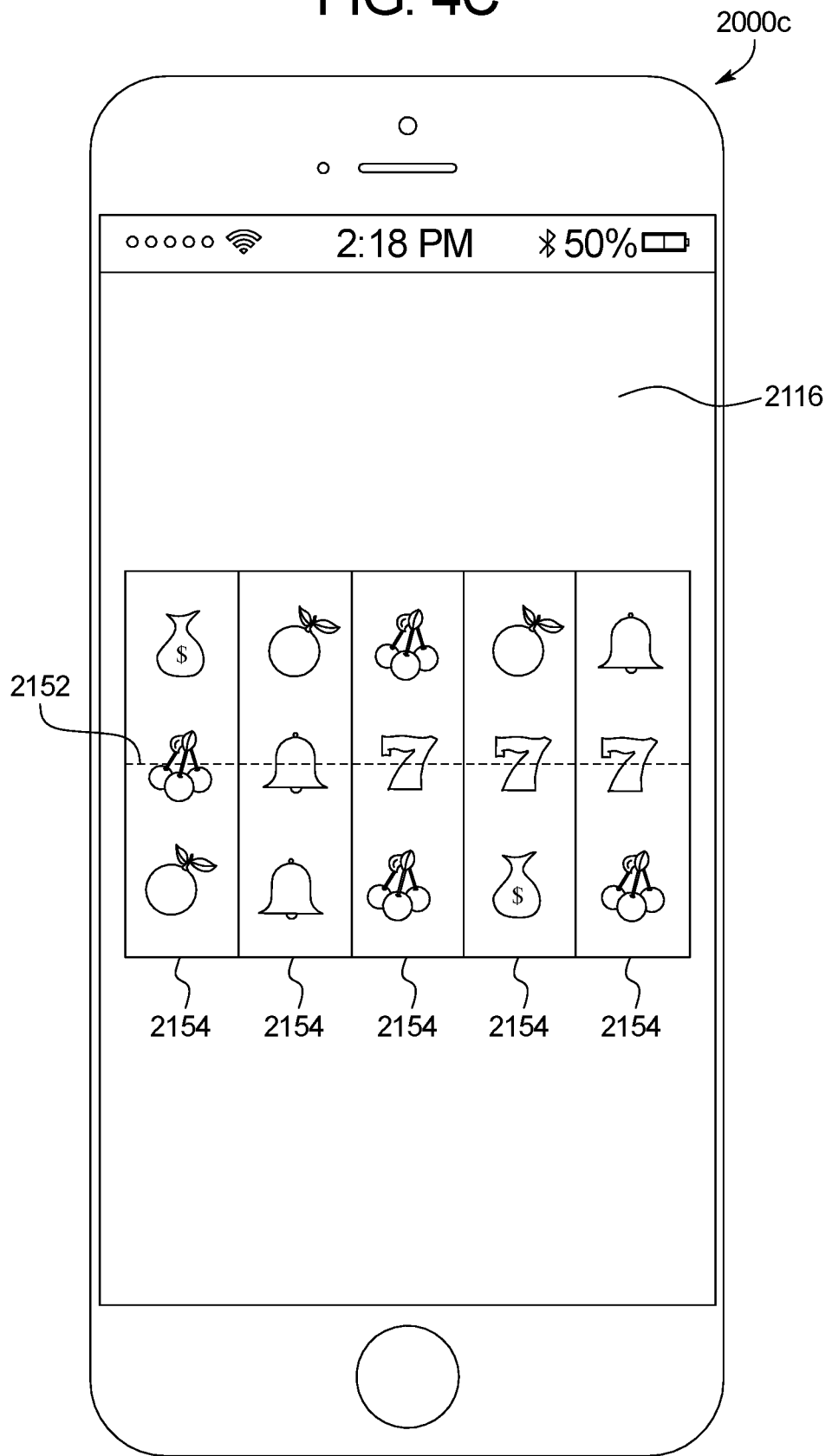
FIG. 4C is a front view of an example personal gaming device of the gaming system disclosed herein.

FIG. 3 is a block diagram of an example EGM 1000 and FIGS. 4A and 4B include two different example EGMs 2000a and 2000b. The EGMs 1000, 2000a, and 2000b are merely example EGMs, and different EGMs may be implemented using different combinations of the components shown in the EGMs 1000, 2000a, and 2000b. Although the below refers to EGMs, in various embodiments personal gaming devices (such as personal gaming device 2000c of FIG. 4C) may include some or all of the below components.

In these embodiments, the EGM 1000 includes a master gaming controller 1012 configured to communicate with and to operate with a plurality of peripheral devices 1022.

The master gaming controller 1012 includes at least one processor 1010. The at least one processor 1010 is any suitable processing device or set of processing devices, such as a microprocessor, a microcontroller-based platform, a suitable integrated circuit, or one or more application-specific integrated circuits (ASICs), configured to execute software enabling various configuration and reconfiguration tasks, such as: (1) communicating with a remote source (such as a server that stores authentication information or game information) via a communication interface 1006 of the master gaming controller 1012; (2) converting signals read by an interface to a format corresponding to that used by software or memory of the EGM; (3) accessing memory to configure or reconfigure game parameters in the memory according to indicia read from the EGM; (4) communicating with interfaces and the peripheral devices 1022 (such as input/output devices); and/or (5) controlling the peripheral devices 1022. In certain embodiments, one or more components of the master gaming controller 1012 (such as the at least one processor 1010) reside within a housing of the EGM (described below), while in other embodiments at least one component of the master gaming controller 1012 resides outside of the housing of the EGM.

The master gaming controller 1012 also includes at least one memory device 1016, which includes: (1) volatile memory (e.g., RAM 1009, which can include non-volatile RAM, magnetic RAM, ferroelectric RAM, and any other suitable forms); (2) non-volatile memory 1019 (e.g., disk memory, FLASH memory, EPROMs, EEPROMs, memristor-based non-volatile solid-state memory, etc.); (3) unalterable memory (e.g., EPROMs 1008); (4) read-only memory; and/or (5) a secondary memory storage device 1015, such as a non-volatile memory device, configured to store gaming software related information (the gaming software related information and the memory may be used to store various audio files and games not currently being used and invoked in a configuration or reconfiguration). Any other suitable magnetic, optical, and/or semiconductor memory may operate in conjunction with the EGM disclosed herein. In certain embodiments, the at least one memory device 1016 resides within the housing of the EGM (described below), while in other embodiments at least one component of the at least one memory device 1016 resides outside of the housing of the EGM. In these embodiments, any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

The at least one memory device 1016 is configured to store, for example: (1) configuration software 1014, such as all the parameters and settings for a game playable on the EGM; (2) associations 1018 between configuration indicia read from an EGM with one or more parameters and settings; (3) communication protocols configured to enable the at least one processor 1010 to communicate with the peripheral devices 1022; and/or (4) communication transport protocols (such as TCP/IP, USB, Firewire, IEEE1394, Bluetooth, IEEE 802.11x (IEEE 802.11 standards), hiperlan/2, HomeRF, etc.) configured to enable the EGM to communicate with local and non-local devices using such protocols. In one implementation, the master gaming controller 1012 communicates with other devices using a serial communication protocol. A few non-limiting examples of serial communication protocols that other devices, such as peripherals (e.g., a bill validator or a ticket printer), may use to communicate with the master game controller 1012 include USB, RS-232, and Netplex (a proprietary protocol developed by IGT).

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the player's computer, partly on the player's computer, as a stand-alone software package, partly on the player's computer and partly on a remote computer or entirely on the remote computer or server. In the latter scenario, the remote computer may be connected to the player's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

In certain embodiments, the at least one memory device 1016 is configured to store program code and instructions executable by the at least one processor of the EGM to control the EGM. The at least one memory device 1016 of the EGM also stores other operating data, such as image data, event data, input data, random number generators (RNGs) or pseudo-RNGs, paytable data or information, and/or applicable game rules that relate to the play of one or more games on the EGM. In various embodiments, part or all of the program code and/or the operating data described above is stored in at least one detachable or removable memory device including, but not limited to, a cartridge, a disk, a CD ROM, a DVD, a USB memory device, or any other suitable non-transitory computer readable medium. In certain such embodiments, an operator (such as a gaming establishment operator) and/or a player uses such a removable memory device in an EGM to implement at least part of the present disclosure. In other embodiments, part or all of the program code and/or the operating data is downloaded to the at least one memory device of the EGM through any suitable data network described above (such as an Internet or intranet).

The at least one memory device 1016 also stores a plurality of device drivers 1042. Examples of different types of device drivers include device drivers for EGM components and device drivers for the peripheral components 1022. Typically, the device drivers 1042 utilize various communication protocols that enable communication with a particular physical device. The device driver abstracts the hardware implementation of that device. For example, a device driver may be written for each type of card reader that could potentially be connected to the EGM. Non-limiting examples of communication protocols used to implement the device drivers include Netplex, USB, Serial, Ethernet 175, Firewire, I/O debouncer, direct memory map, serial, PCI, parallel, RF, Bluetooth™, near-field communications (e.g., using near-field magnetics), 802.11 (WiFi), etc. In one embodiment, when one type of a particular device is exchanged for another type of the particular device, the at least one processor of the EGM loads the new device driver from the at least one memory device to enable communication with the new device. For instance, one type of card reader in the EGM can be replaced with a second different type of card reader when device drivers for both card readers are stored in the at least one memory device.

In certain embodiments, the software units stored in the at least one memory device 1016 can be upgraded as needed. For instance, when the at least one memory device 1016 is a hard drive, new games, new game options, new parameters, new settings for existing parameters, new settings for new parameters, new device drivers, and new communication protocols can be uploaded to the at least one memory device 1016 from the master game controller 1012 or from some other external device. As another example, when the at least one memory device 1016 includes a CD/DVD drive including a CD/DVD configured to store game options, parameters, and settings, the software stored in the at least one memory device 1016 can be upgraded by replacing a first CD/DVD with a second CD/DVD. In yet another example, when the at least one memory device 1016 uses flash memory 1019 or EPROM 1008 units configured to store games, game options, parameters, and settings, the software stored in the flash and/or EPROM memory units can be upgraded by replacing one or more memory units with new memory units that include the upgraded software. In another embodiment, one or more of the memory devices, such as the hard drive, may be employed in a game software download process from a remote software server.

In some embodiments, the at least one memory device 1016 also stores authentication and/or validation components 1044 configured to authenticate/validate specified EGM components and/or information, such as hardware components, software components, firmware components, peripheral device components, player input device components, information received from one or more player input devices, information stored in the at least one memory device 1016, etc. Examples of various authentication and/or validation components are described in U.S. Pat. No. 6,620,047, entitled "Electronic Gaming Apparatus Having Authentication Data Sets".

In certain embodiments, the peripheral devices 1022 include several device interfaces, such as: (1) at least one output device 1020 including at least one display device 1035; (2) at least one input device 1030 (which may include contact and/or non-contact interfaces); (3) at least one transponder 1054; (4) at least one wireless communication component 1056; (5) at least one wired/wireless power distribution component 1058; (6) at least one sensor 1060; (7) at least one data preservation component 1062; (8) at least one motion/gesture analysis and interpretation component 1064; (9) at least one motion detection component 1066; (10) at least one portable power source 1068; (11) at least one geolocation module 1076; (12) at least one player identification module 1077; (13) at least one player/device tracking module 1078; and (14) at least one information filtering module 1079.

The at least one output device 1020 includes at least one display device 1035 configured to display any game(s) displayed by the EGM and any suitable information associated with such game(s). In certain embodiments, the display devices are connected to or mounted on a housing of the EGM (described below). In various embodiments, the display devices serve as digital glass configured to advertise certain games or other aspects of the gaming establishment in which the EGM is located. In various embodiments, the EGM includes one or more of the following display devices: (a) a central display device; (b) a player tracking display configured to display various information regarding a player's player tracking status (as described below); (c) a secondary or upper display device in addition to the central display device and the player tracking display; (d) a credit display configured to display a current quantity of credits, amount of cash, account balance, or the equivalent; and (e) a bet display configured to display an amount wagered for one or more plays of one or more games. The example EGM 2000*a* illustrated in FIG. 4A includes a central display device 2116, a player tracking display 2140, a credit display 2120, and a bet display 2122. The example EGM 2000*b* illustrated in FIG. 4B includes a central display device 2116, an upper display device 2118, a player tracking display 2140, a credit display 2120, and a bet display 2122.

In various embodiments, the display devices include, without limitation: a monitor, a television display, a plasma display, a liquid crystal display (LCD), a display based on light emitting diodes (LEDs), a display based on a plurality of organic light-emitting diodes (OLEDs), a display based on polymer light-emitting diodes (PLEDs), a display based on a plurality of surface-conduction electron-emitters (SEDs), a display including a projected and/or reflected image, or any other suitable electronic device or display mechanism. In certain embodiments, as described above, the display device includes a touch-screen with an associated touch-screen controller. The display devices may be of any suitable sizes, shapes, and configurations.

The display devices of the EGM are configured to display one or more game and/or non-game images, symbols, and indicia. In certain embodiments, the display devices of the EGM are configured to display any suitable visual representation or exhibition of the movement of objects; dynamic lighting; video images; images of people, characters, places, things, and faces of cards; and the like. In certain embodiments, the display devices of the EGM are configured to display one or more video reels, one or more video wheels, and/or one or more video dice. In other embodiments, certain of the displayed images, symbols, and indicia are in mechanical form. That is, in these embodiments, the display device includes any electromechanical device, such as one or more rotatable wheels, one or more reels, and/or one or more dice, configured to display at least one or a plurality of game or other suitable images, symbols, or indicia.

In various embodiments, the at least one output device 1020 includes a payout device. In these embodiments, after the EGM receives an actuation of a cashout device (described below), the EGM causes the payout device to provide a payment to the player. In one embodiment, the payout device is one or more of: (a) a ticket printer and dispenser configured to print and dispense a ticket or credit slip associated with a monetary value, wherein the ticket or credit slip may be redeemed for its monetary value via a cashier, a kiosk, or other suitable redemption system; (b) a bill dispenser configured to dispense paper currency; (c) a coin dispenser configured to dispense coins or tokens (such as into a coin payout tray); and (d) any suitable combination thereof. The example EGMs 2000*a* and 2000*b* illustrated in FIGS. 4A and 4B each include a ticket printer and dispenser 2136. Examples of ticket-in ticket-out (TITO) technology are described in U.S. Pat. No. 5,429,361, entitled "Gaming Machine Information, Communication and Display System"; U.S. Pat. No. 5,470,079, entitled "Gaming Machine Accounting and Monitoring System"; U.S. Pat. No. 5,265,874, entitled "Cashless Gaming Apparatus and Method"; U.S. Pat. No. 6,729,957, entitled "Gaming Method and Host Computer with Ticket-In/Ticket-Out Capability"; U.S. Pat. No. 6,729,958, entitled "Gaming System with Ticket-In/Ticket-Out Capability"; U.S. Pat. No. 6,736,725, entitled "Gaming Method and Host Computer with Ticket-In/Ticket-Out Capability"; U.S. Pat. No. 7,275,991, entitled "Slot Machine with Ticket-In/Ticket-Out Capability"; and U.S. Pat. No. 6,048,269, entitled "Coinless Slot Machine System and Method".

In certain embodiments, rather than dispensing bills, coins, or a physical ticket having a monetary value to the player following receipt of an actuation of the cashout device, the payout device is configured to cause a payment to be provided to the player in the form of an electronic funds transfer, such as via a direct deposit into a bank account, a casino account, or a prepaid account of the player; via a transfer of funds onto an electronically recordable identification card or smart card of the player; or via sending a virtual ticket having a monetary value to an electronic device of the player. Examples of providing payment using virtual tickets are described in U.S. Pat. No. 8,613,659, entitled "Virtual Ticket-In and Ticket-Out on a Gaming Machine".

While any credit balances, any wagers, any values, and any awards are described herein as amounts of monetary credits or currency, one or more of such credit balances, such wagers, such values, and such awards may be for non-monetary credits, promotional credits, of player tracking points or credits.

In certain embodiments, the at least one output device 1020 is a sound generating device controlled by one or more sound cards. In one such embodiment, the sound generating device includes one or more speakers or other sound generating hardware and/or software configured to generate sounds, such as by playing music for any games or by playing music for other modes of the EGM, such as an attract mode. The example EGMs 2000a and 2000b illustrated in FIGS. 4A and 4B each include a plurality of speakers 2150. In another such embodiment, the EGM provides dynamic sounds coupled with attractive multimedia images displayed on one or more of the display devices to provide an audio-visual representation or to otherwise display full-motion video with sound to attract players to the EGM. In certain embodiments, the EGM displays a sequence of audio and/or visual attraction messages during idle periods to attract potential players to the EGM. The videos may be customized to provide any appropriate information.

The at least one input device 1030 may include any suitable device that enables an input signal to be produced and received by the at least one processor 1010 of the EGM.

In one embodiment, the at least one input device 1030 includes a payment device configured to communicate with the at least one processor of the EGM to fund the EGM. In certain embodiments, the payment device includes one or more of: (a) a bill acceptor into which paper money is inserted to fund the EGM; (b) a ticket acceptor into which a ticket or a voucher is inserted to fund the EGM; (c) a coin slot into which coins or tokens are inserted to fund the EGM; (d) a reader or a validator for credit cards, debit cards, or credit slips into which a credit card, debit card, or credit slip is inserted to fund the EGM; (e) a player identification card reader into which a player identification card is inserted to fund the EGM; or (f) any suitable combination thereof. The example EGMs 2000a and 2000b illustrated in FIGS. 4A and 4B each include a combined bill and ticket acceptor 2128 and a coin slot 2126.

In one embodiment, the at least one input device 1030 includes a payment device configured to enable the EGM to be funded via an electronic funds transfer, such as a transfer of funds from a bank account. In another embodiment, the EGM includes a payment device configured to communicate with a mobile device of a player, such as a mobile phone, a radio frequency identification tag, or any other suitable wired or wireless device, to retrieve relevant information associated with that player to fund the EGM. Examples of funding an EGM via communication between the EGM and a mobile device (such as a mobile phone) of a player are described in U.S. Patent Application Publication No. 2013/0344942, entitled "Avatar as Security Measure for Mobile Device Use with Electronic Gaming Machine". When the EGM is funded, the at least one processor determines the amount of funds entered and displays the corresponding amount on a credit display or any other suitable display as described below.

In certain embodiments, the at least one input device 1030 includes at least one wagering or betting device. In various embodiments, the one or more wagering or betting devices are each: (1) a mechanical button supported by the housing of the EGM (such as a hard key or a programmable soft key), or (2) an icon displayed on a display device of the EGM (described below) that is actuatable via a touch screen of the EGM (described below) or via use of a suitable input device of the EGM (such as a mouse or a joystick). One such wagering or betting device is as a maximum wager or bet device that, when actuated, causes the EGM to place a maximum wager on a play of a game. Another such wagering or betting device is a repeat bet device that, when actuated, causes the EGM to place a wager that is equal to the previously-placed wager on a play of a game. A further such wagering or betting device is a bet one device that, when actuated, causes the EGM to increase the wager by one credit. Generally, upon actuation of one of the wagering or betting devices, the quantity of credits displayed in a credit meter (described below) decreases by the amount of credits wagered, while the quantity of credits displayed in a bet display (described below) increases by the amount of credits wagered.

In various embodiments, the at least one input device 1030 includes at least one game play activation device. In various embodiments, the one or more game play initiation devices are each: (1) a mechanical button supported by the housing of the EGM (such as a hard key or a programmable soft key), or (2) an icon displayed on a display device of the EGM (described below) that is actuatable via a touch screen of the EGM (described below) or via use of a suitable input device of the EGM (such as a mouse or a joystick). After a player appropriately funds the EGM and places a wager, the EGM activates the game play activation device to enable the player to actuate the game play activation device to initiate a play of a game on the EGM (or another suitable sequence of events associated with the EGM). After the EGM receives an actuation of the game play activation device, the EGM initiates the play of the game. The example EGMs 2000a and 2000b illustrated in FIGS. 4A and 4B each include a game play activation device in the form of a game play initiation button 2132. In other embodiments, the EGM begins game play automatically upon appropriate funding rather than upon utilization of the game play activation device.

In other embodiments, the at least one input device 1030 includes a cashout device. In various embodiments, the cashout device is: (1) a mechanical button supported by the housing of the EGM (such as a hard key or a programmable soft key), or (2) an icon displayed on a display device of the EGM (described below) that is actuatable via a touch screen of the EGM (described below) or via use of a suitable input device of the EGM (such as a mouse or a joystick). When the EGM receives an actuation of the cashout device from a player and the player has a positive (i.e., greater-than-zero)

credit balance, the EGM initiates a payout associated with the player's credit balance. The example EGMs 2000*a* and 2000*b* illustrated in FIGS. 4A and 4B each include a cashout device in the form of a cashout button 2134.

In various embodiments, the at least one input device 1030 includes a plurality of buttons that are programmable by the EGM operator to, when actuated, cause the EGM to perform particular functions. For instance, such buttons may be hard keys, programmable soft keys, or icons icon displayed on a display device of the EGM (described below) that are actuatable via a touch screen of the EGM (described below) or via use of a suitable input device of the EGM (such as a mouse or a joystick). The example EGMs 2000*a* and 2000*b* illustrated in FIGS. 4A and 4B each include a plurality of such buttons 2130.

In certain embodiments, the at least one input device 1030 includes a touch-screen coupled to a touch-screen controller or other touch-sensitive display overlay to enable interaction with any images displayed on a display device (as described below). One such input device is a conventional touch-screen button panel. The touch-screen and the touch-screen controller are connected to a video controller. In these embodiments, signals are input to the EGM by touching the touch screen at the appropriate locations.

In embodiments including a player tracking system, as further described below, the at least one input device 1030 includes a card reader in communication with the at least one processor of the EGM. The example EGMs 2000*a* and 2000*b* illustrated in FIGS. 4A and 4B each include a card reader 2138. The card reader is configured to read a player identification card inserted into the card reader.

The at least one wireless communication component 1056 includes one or more communication interfaces having different architectures and utilizing a variety of protocols, such as (but not limited to) 802.11 (WiFi); 802.15 (including Bluetooth™); 802.16 (WiMax); 802.22; cellular standards such as CDMA, CDMA2000, and WCDMA; Radio Frequency (e.g., RFID); infrared; and Near Field Magnetic communication protocols. The at least one wireless communication component 1056 transmits electrical, electromagnetic, or optical signals that carry digital data streams or analog signals representing various types of information.

The at least one wired/wireless power distribution component 1058 includes components or devices that are configured to provide power to other devices. For example, in one embodiment, the at least one power distribution component 1058 includes a magnetic induction system that is configured to provide wireless power to one or more player input devices near the EGM. In one embodiment, a player input device docking region is provided, and includes a power distribution component that is configured to recharge a player input device without requiring metal-to-metal contact. In one embodiment, the at least one power distribution component 1058 is configured to distribute power to one or more internal components of the EGM, such as one or more rechargeable power sources (e.g., rechargeable batteries) located at the EGM.

In certain embodiments, the at least one sensor 1060 includes at least one of: optical sensors, pressure sensors, RF sensors, infrared sensors, image sensors, thermal sensors, and biometric sensors. The at least one sensor 1060 may be used for a variety of functions, such as: detecting movements and/or gestures of various objects within a predetermined proximity to the EGM; detecting the presence and/or identity of various persons (e.g., players, casino employees, etc.), devices (e.g., player input devices), and/or systems within a predetermined proximity to the EGM.

The at least one data preservation component 1062 is configured to detect or sense one or more events and/or conditions that, for example, may result in damage to the EGM and/or that may result in loss of information associated with the EGM. Additionally, the data preservation system 1062 may be operable to initiate one or more appropriate action(s) in response to the detection of such events/conditions.

The at least one motion/gesture analysis and interpretation component 1064 is configured to analyze and/or interpret information relating to detected player movements and/or gestures to determine appropriate player input information relating to the detected player movements and/or gestures. For example, in one embodiment, the at least one motion/gesture analysis and interpretation component 1064 is configured to perform one or more of the following functions: analyze the detected gross motion or gestures of a player; interpret the player's motion or gestures (e.g., in the context of a casino game being played) to identify instructions or input from the player; utilize the interpreted instructions/input to advance the game state; etc. In other embodiments, at least a portion of these additional functions may be implemented at a remote system or device.

The at least one portable power source 1068 enables the EGM to operate in a mobile environment. For example, in one embodiment, the EGM 300 includes one or more rechargeable batteries.

The at least one geolocation module 1076 is configured to acquire geolocation information from one or more remote sources and use the acquired geolocation information to determine information relating to a relative and/or absolute position of the EGM. For example, in one implementation, the at least one geolocation module 1076 is configured to receive GPS signal information for use in determining the position or location of the EGM. In another implementation, the at least one geolocation module 1076 is configured to receive multiple wireless signals from multiple remote devices (e.g., EGMs, servers, wireless access points, etc.) and use the signal information to compute position/location information relating to the position or location of the EGM.

The at least one player identification module 1077 is configured to determine the identity of the current player or current owner of the EGM. For example, in one embodiment, the current player is required to perform a login process at the EGM in order to access one or more features. Alternatively, the EGM is configured to automatically determine the identity of the current player based on one or more external signals, such as an RFID tag or badge worn by the current player and that provides a wireless signal to the EGM that is used to determine the identity of the current player. In at least one embodiment, various security features are incorporated into the EGM to prevent unauthorized players from accessing confidential or sensitive information.

The at least one information filtering module 1079 is configured to perform filtering (e.g., based on specified criteria) of selected information to be displayed at one or more displays 1035 of the EGM.

In various embodiments, the EGM includes a plurality of communication ports configured to enable the at least one processor of the EGM to communicate with and to operate with external peripherals, such as: accelerometers, arcade sticks, bar code readers, bill validators, biometric input devices, bonus devices, button panels, card readers, coin dispensers, coin hoppers, display screens or other displays or video sources, expansion buses, information panels, keypads, lights, mass storage devices, microphones, motion sensors, motors, printers, reels, SCSI ports, solenoids, speakers, thumbsticks, ticket readers, touch screens, trackballs, touchpads, wheels, and wireless communication devices. U.S. Pat. No. 7,290,072 describes a variety of EGMs including one or more communication ports that enable the EGMs to communicate and operate with one or more external peripherals.

As generally described above, in certain embodiments, such as the example EGMs 2000a and 2000b illustrated in FIGS. 4A and 4B, the EGM has a support structure, housing, or cabinet that provides support for a plurality of the input devices and the output devices of the EGM. Further, the EGM is configured such that a player may operate it while standing or sitting. In various embodiments, the EGM is positioned on a base or stand, or is configured as a pub-style tabletop game (not shown) that a player may operate typically while sitting. As illustrated by the different example EGMs 2000a and 2000b shown in FIGS. 4A and 4B, EGMs may have varying housing and display configurations.

In certain embodiments, the EGM is a device that has obtained approval from a regulatory gaming commission, and in other embodiments, the EGM is a device that has not obtained approval from a regulatory gaming commission.

The EGMs described above are merely three examples of different types of EGMs. Certain of these example EGMs may include one or more elements that may not be included in all gaming systems, and these example EGMs may not include one or more elements that are included in other gaming systems. For example, certain EGMs include a coin acceptor while others do not.

Operation of Primary or Base Games and/or Secondary or Bonus Games

In various embodiments, an EGM may be implemented in one of a variety of different configurations. In various embodiments, the EGM may be implemented as one of: (a) a dedicated EGM in which computerized game programs executable by the EGM for controlling any primary or base games (referred to herein as "primary games") and/or any secondary or bonus games or other functions (referred to herein as "secondary games") displayed by the EGM are provided with the EGM before delivery to a gaming establishment or before being provided to a player; and (b) a changeable EGM in which computerized game programs executable by the EGM for controlling any primary games and/or secondary games displayed by the EGM are downloadable or otherwise transferred to the EGM through a data network or remote communication link; from a USB drive, flash memory card, or other suitable memory device; or in any other suitable manner after the EGM is physically located in a gaming establishment or after the EGM is provided to a player.

As generally explained above, in various embodiments in which the gaming system includes a central server, central controller, or remote host and a changeable EGM, the at least one memory device of the central server, central controller, or remote host stores different game programs and instructions executable by the at least one processor of the changeable EGM to control one or more primary games and/or secondary games displayed by the changeable EGM. More specifically, each such executable game program represents a different game or a different type of game that the at least one changeable EGM is configured to operate. In one example, certain of the game programs are executable by the changeable EGM to operate games having the same or substantially the same game play but different paytables. In different embodiments, each executable game program is associated with a primary game, a secondary game, or both. In certain embodiments, an executable game program is executable by the at least one processor of the at least one changeable EGM as a secondary game to be played simultaneously with a play of a primary game (which may be downloaded to or otherwise stored on the at least one changeable EGM), or vice versa.

In operation of such embodiments, the central server, central controller, or remote host is configured to communicate one or more of the stored executable game programs to the at least one processor of the changeable EGM. In different embodiments, a stored executable game program is communicated or delivered to the at least one processor of the changeable EGM by: (a) embedding the executable game program in a device or a component (such as a microchip to be inserted into the changeable EGM); (b) writing the executable game program onto a disc or other media; or (c) uploading or streaming the executable game program over a data network (such as a dedicated data network). After the executable game program is communicated from the central server, central controller, or remote host to the changeable EGM, the at least one processor of the changeable EGM executes the executable game program to enable the primary game and/or the secondary game associated with that executable game program to be played using the display device(s) and/or the input device(s) of the changeable EGM. That is, when an executable game program is communicated to the at least one processor of the changeable EGM, the at least one processor of the changeable EGM changes the game or the type of game that may be played using the changeable EGM.

In certain embodiments, the gaming system randomly determines any game outcome(s) (such as a win outcome) and/or award(s) (such as a quantity of credits to award for the win outcome) for a play of a primary game and/or a play of a secondary game based on probability data. In certain such embodiments, this random determination is provided through utilization of an RNG, such as a true RNG or a pseudo RNG, or any other suitable randomization process. In one such embodiment, each game outcome or award is associated with a probability, and the gaming system generates the game outcome(s) and/or the award(s) to be provided based on the associated probabilities. In these embodiments, since the gaming system generates game outcomes and/or awards randomly or based on one or more probability calculations, there is no certainty that the gaming system will ever provide any specific game outcome and/or award.

In certain embodiments, the gaming system maintains one or more predetermined pools or sets of predetermined game outcomes and/or awards. In certain such embodiments, upon generation or receipt of a game outcome and/or award request, the gaming system independently selects one of the predetermined game outcomes and/or awards from the one or more pools or sets. The gaming system flags or marks the selected game outcome and/or award as used. Once a game outcome or an award is flagged as used, it is prevented from further selection from its respective pool or set; that is, the gaming system does not select that game outcome or award upon another game outcome and/or award request. The gaming system provides the selected game outcome and/or award. Examples of this type of award evaluation are described in U.S. Pat. No. 7,470,183, entitled "Finite Pool Gaming Method and Apparatus"; U.S. Pat. No. 7,563,163, entitled "Gaming Device Including Outcome Pools for Providing Game Outcomes"; U.S. Pat. No. 7,833,092, entitled "Method and System for Compensating for Player Choice in a Game of Chance"; U.S. Pat. No. 8,070,579, entitled "Bingo System with Downloadable Common Patterns"; and U.S. Pat. No. 8,398,472, entitled "Central Determination Poker Game".

In certain embodiments, the gaming system determines a predetermined game outcome and/or award based on the results of a bingo, keno, or lottery game. In certain such embodiments, the gaming system utilizes one or more bingo, keno, or lottery games to determine the predetermined game outcome and/or award provided for a primary game and/or a secondary game. The gaming system is provided or associated with a bingo card. Each bingo card consists of a matrix or array of elements, wherein each element is designated with separate indicia. After a bingo card is provided, the gaming system randomly selects or draws a plurality of the elements. As each element is selected, a determination is made as to whether the selected element is present on the bingo card. If the selected element is present on the bingo card, that selected element on the provided bingo card is marked or flagged. This process of selecting elements and marking any selected elements on the provided bingo cards continues until one or more predetermined patterns are marked on one or more of the provided bingo cards. After one or more predetermined patterns are marked on one or more of the provided bingo cards, game outcome and/or award is determined based, at least in part, on the selected elements on the provided bingo cards. Examples of this type of award determination are described in U.S. Pat. No. 7,753,774, entitled "Using Multiple Bingo Cards to Represent Multiple Slot Paylines and Other Class III Game Options"; U.S. Pat. No. 7,731,581, entitled "Multi-Player Bingo Game with Multiple Alternative Outcome Displays"; U.S. Pat. No. 7,955,170, entitled "Providing Non-Bingo Outcomes for a Bingo Game"; U.S. Pat. No. 8,070,579, entitled "Bingo System with Downloadable Common Patterns"; and U.S. Pat. No. 8,500,538, entitled "Bingo Gaming System and Method for Providing Multiple Outcomes from Single Bingo Pattern".

In certain embodiments in which the gaming system includes a central server, central controller, or remote host and an EGM, the EGM is configured to communicate with the central server, central controller, or remote host for monitoring purposes only. In such embodiments, the EGM determines the game outcome(s) and/or award(s) to be provided in any of the manners described above, and the central server, central controller, or remote host monitors the activities and events occurring on the EGM. In one such embodiment, the gaming system includes a real-time or online accounting and gaming information system configured to communicate with the central server, central controller, or remote host. In this embodiment, the accounting and gaming information system includes: (a) a player database configured to store player profiles, (b) a player tracking module configured to track players (as described below), and (c) a credit system configured to provide automated transactions. Examples of such accounting systems are described in U.S. Pat. No. 6,913,534, entitled "Gaming Machine Having a Lottery Game and Capability for Integration with Gaming Device Accounting System and Player Tracking System," and 8,597,116, entitled "Virtual Player Tracking and Related Services".

As noted above, in various embodiments, the gaming system includes one or more executable game programs executable by at least one processor of the gaming system to provide one or more primary games and one or more secondary games. The primary game(s) and the secondary game(s) may comprise any suitable games and/or wagering games, such as, but not limited to: electro-mechanical or video slot or spinning reel type games; video card games such as video draw poker, multi-hand video draw poker, other video poker games, video blackjack games, and video baccarat games; video keno games; video bingo games; and video selection games.

In certain embodiments in which the primary game is a slot or spinning reel type game, the gaming system includes one or more reels in either an electromechanical form with mechanical rotating reels or in a video form with simulated reels and movement thereof. Each reel displays a plurality of indicia or symbols, such as bells, hearts, fruits, numbers, letters, bars, or other images that typically correspond to a theme associated with the gaming system. In certain such embodiments, the gaming system includes one or more paylines associated with the reels. The example EGM 2000*b* shown in FIG. 4B includes a payline 1152 and a plurality of reels 1154. In certain embodiments, one or more of the reels are independent reels or unisymbol reels. In such embodiments, each independent reel generates and displays one symbol.

In various embodiments, one or more of the paylines is horizontal, vertical, circular, diagonal, angled, or any suitable combination thereof. In other embodiments, each of one or more of the paylines is associated with a plurality of adjacent symbol display areas on a requisite number of adjacent reels. In one such embodiment, one or more paylines are formed between at least two symbol display areas that are adjacent to each other by either sharing a common side or sharing a common corner (i.e., such paylines are connected paylines). The gaming system enables a wager to be placed on one or more of such paylines to activate such paylines. In other embodiments in which one or more paylines are formed between at least two adjacent symbol display areas, the gaming system enables a wager to be placed on a plurality of symbol display areas, which activates those symbol display areas.

In various embodiments, the gaming system provides one or more awards after a spin of the reels when specified types and/or configurations of the indicia or symbols on the reels occur on an active payline or otherwise occur in a winning pattern, occur on the requisite number of adjacent reels, and/or occur in a scatter pay arrangement.

In certain embodiments, the gaming system employs a ways to win award determination. In these embodiments, any outcome to be provided is determined based on a number of associated symbols that are generated in active symbol display areas on the requisite number of adjacent reels (i.e., not on paylines passing through any displayed winning symbol combinations). If a winning symbol combination is generated on the reels, one award for that occurrence of the generated winning symbol combination is provided. Examples of ways to win award determinations are described in U.S. Pat. No. 8,012,011, entitled "Gaming Device and Method Having Independent Reels and Multiple Ways of Winning"; U.S. Pat. No. 8,241,104, entitled "Gaming Device and Method Having Designated Rules for Determining Ways To Win"; and U.S. Pat. No. 8,430,739, entitled "Gaming System and Method Having Wager Dependent Different Symbol Evaluations".

In various embodiments, the gaming system includes a progressive award. Typically, a progressive award includes an initial amount and an additional amount funded through a portion of each wager placed to initiate a play of a primary game. When one or more triggering events occurs, the gaming system provides at least a portion of the progressive award. After the gaming system provides the progressive award, an amount of the progressive award is reset to the initial amount and a portion of each subsequent wager is allocated to the next progressive award. Examples of progressive gaming systems are described in U.S. Pat. No. 7,585,223, entitled "Server Based Gaming System Having Multiple Progressive Awards"; U.S. Pat. No. 7,651,392, entitled "Gaming Device System Having Partial Progressive Payout"; U.S. Pat. No. 7,666,093, entitled "Gaming Method and Device Involving Progressive Wagers"; U.S. Pat. No. 7,780,523, entitled "Server Based Gaming System Having Multiple Progressive Awards"; and U.S. Pat. No. 8,337,298, entitled "Gaming Device Having Multiple Different Types of Progressive Awards".

As generally noted above, in addition to providing winning credits or other awards for one or more plays of the primary game(s), in various embodiments the gaming system provides credits or other awards for one or more plays of one or more secondary games. The secondary game typically enables an award to be obtained addition to any award obtained through play of the primary game(s). The secondary game(s) typically produces a higher level of player excitement than the primary game(s) because the secondary game(s) provides a greater expectation of winning than the primary game(s) and is accompanied with more attractive or unusual features than the primary game (s). The secondary game(s) may be any type of suitable game, either similar to or completely different from the primary game.

In various embodiments, the gaming system automatically provides or initiates the secondary game upon the occurrence of a triggering event or the satisfaction of a qualifying condition. In other embodiments, the gaming system initiates the secondary game upon the occurrence of the triggering event or the satisfaction of the qualifying condition and upon receipt of an initiation input. In certain embodiments, the triggering event or qualifying condition is a selected outcome in the primary game(s) or a particular arrangement of one or more indicia on a display device for a play of the primary game(s), such as a "BONUS" symbol appearing on three adjacent reels along a payline following a spin of the reels for a play of the primary game. In other embodiments, the triggering event or qualifying condition occurs based on a certain amount of game play (such as number of games, number of credits, amount of time) being exceeded, or based on a specified number of points being earned during game play. Any suitable triggering event or qualifying condition or any suitable combination of a plurality of different triggering events or qualifying conditions may be employed.

In other embodiments, at least one processor of the gaming system randomly determines when to provide one or more plays of one or more secondary games. In one such embodiment, no apparent reason is provided for providing the secondary game. In this embodiment, qualifying for a secondary game is not triggered by the occurrence of an event in any primary game or based specifically on any of the plays of any primary game. That is, qualification is provided without any explanation or, alternatively, with a simple explanation. In another such embodiment, the gaming system determines qualification for a secondary game at least partially based on a game triggered or symbol triggered event, such as at least partially based on play of a primary game.

In various embodiments, after qualification for a secondary game has been determined, the secondary game participation may be enhanced through continued play on the primary game. Thus, in certain embodiments, for each secondary game qualifying event, such as a secondary game symbol, that is obtained, a given number of secondary game wagering points or credits is accumulated in a "secondary game meter" configured to accrue the secondary game wagering credits or entries toward eventual participation in the secondary game. In one such embodiment, the occurrence of multiple such secondary game qualifying events in the primary game results in an arithmetic or exponential increase in the number of secondary game wagering credits awarded. In another such embodiment, any extra secondary game wagering credits may be redeemed during the secondary game to extend play of the secondary game.

In certain embodiments, no separate entry fee or buy-in for the secondary game is required. That is, entry into the secondary game cannot be purchased; rather, in these embodiments entry must be won or earned through play of the primary game, thereby encouraging play of the primary game. In other embodiments, qualification for the secondary game is accomplished through a simple "buy-in." For example, qualification through other specified activities is unsuccessful, payment of a fee or placement of an additional wager "buys-in" to the secondary game. In certain embodiments, a separate side wager must be placed on the secondary game or a wager of a designated amount must be placed on the primary game to enable qualification for the secondary game. In these embodiments, the secondary game triggering event must occur and the side wager (or designated primary game wager amount) must have been placed for the secondary game to trigger.

In various embodiments in which the gaming system includes a plurality of EGMs, the EGMs are configured to communicate with one another to provide a group gaming environment. In certain such embodiments, the EGMs enable players of those EGMs to work in conjunction with one another, such as by enabling the players to play together as a team or group, to win one or more awards. In other such embodiments, the EGMs enable players of those EGMs to compete against one another for one or more awards. In one such embodiment, the EGMs enable the players of those EGMs to participate in one or more gaming tournaments for one or more awards. Examples of group gaming systems are described in U.S. Pat. No. 8,070,583, entitled "Server Based Gaming System and Method for Selectively Providing One or More Different Tournaments"; U.S. Pat. No. 8,500,548, entitled "Gaming System and Method for Providing Team Progressive Awards"; and U.S. Pat. No. 8,562,423, entitled "Method and Apparatus for Rewarding Multiple Game Players for a Single Win".

In various embodiments, the gaming system includes one or more player tracking systems. Such player tracking systems enable operators of the gaming system (such as casinos or other gaming establishments) to recognize the value of customer loyalty by identifying frequent customers and rewarding them for their patronage. Such a player tracking system is configured to track a player's gaming activity. In one such embodiment, the player tracking system does so through the use of player tracking cards. In this embodiment, a player is issued a player identification card that has an encoded player identification number that uniquely identifies the player. When the player's playing tracking card is inserted into a card reader of the gaming system to begin a gaming session, the card reader reads the player identification number off the player tracking card to identify the player. The gaming system timely tracks any suitable information or data relating to the identified player's gaming session. The gaming system also timely tracks when the player tracking card is removed to conclude play for that gaming session. In another embodiment, rather than requiring insertion of a player tracking card into the card reader, the gaming system utilizes one or more portable devices, such as a mobile phone, a radio frequency identification tag, or any other suitable wireless device, to track when a gaming session begins and ends. In another embodiment, the gaming system utilizes any suitable biometric technology or ticket technology to track when a gaming session begins and ends.

In such embodiments, during one or more gaming sessions, the gaming system tracks any suitable information or data, such as any amounts wagered, average wager amounts, and/or the time at which these wagers are placed. In different embodiments, for one or more players, the player tracking system includes the player's account number, the player's card number, the player's first name, the player's surname, the player's preferred name, the player's player tracking ranking, any promotion status associated with the player's player tracking card, the player's address, the player's birthday, the player's anniversary, the player's recent gaming sessions, or any other suitable data. In various embodiments, such tracked information and/or any suitable feature associated with the player tracking system is displayed on a player tracking display. In various embodiments, such tracked information and/or any suitable feature associated with the player tracking system is displayed via one or more service windows that are displayed on the central display device and/or the upper display device. Examples of player tracking systems are described in U.S. Pat. No. 6,722,985, entitled "Universal Player Tracking System"; U.S. Pat. No. 6,908,387, entitled "Player Tracking Communication Mechanisms in a Gaming Machine"; U.S. Pat. No. 7,311,605, entitled "Player Tracking Assembly for Complete Patron Tracking for Both Gaming and Non-Gaming Casino Activity"; U.S. Pat. No. 7,611,411, entitled "Player Tracking Instruments Having Multiple Communication Modes"; U.S. Pat. No. 7,617,151, entitled "Alternative Player Tracking Techniques"; and U.S. Pat. No. 8,057,298, entitled "Virtual Player Tracking and Related Services".

Web-Based Gaming

In various embodiments, the gaming system includes one or more servers configured to communicate with a personal gaming device-such as a smartphone, a tablet computer, a desktop computer, or a laptop computer- to enable web-based game play using the personal gaming device. In various embodiments, the player must first access a gaming website via an Internet browser of the personal gaming device or execute an application (commonly called an "app") installed on the personal gaming device before the player can use the personal gaming device to participate in web-based game play. In certain embodiments, the one or more servers and the personal gaming device operate in a thin-client environment. In these embodiments, the personal gaming device receives inputs via one or more input devices (such as a touch screen and/or physical buttons), the personal gaming device sends the received inputs to the one or more servers, the one or more servers make various determinations based on the inputs and determine content to be displayed (such as a randomly determined game outcome and corresponding award), the one or more servers send the content to the personal gaming device, and the personal gaming device displays the content.

In certain such embodiments, the one or more servers must identify the player before enabling game play on the personal gaming device (or, in some embodiments, before enabling monetary wager-based game play on the personal gaming device). In these embodiments, the player must identify herself to the one or more servers, such as by inputting the player's unique playername and password combination, providing an input to a biometric sensor (e.g., a fingerprint sensor, a retinal sensor, a voice sensor, or a facial-recognition sensor), or providing any other suitable information.

Once identified, the one or more servers enable the player to establish an account balance from which the player can draw credits usable to wager on plays of a game. In certain embodiments, the one or more servers enable the player to initiate an electronic funds transfer to transfer funds from a bank account to the player's account balance. In other embodiments, the one or more servers enable the player to make a payment using the player's credit card, debit card, or other suitable device to add money to the player's account balance. In other embodiments, the one or more servers enable the player to add money to the player's account balance via a peer-to-peer type application, such as PayPal or Venmo. The one or more servers also enable the player to cash out the player's account balance (or part of it) in any suitable manner, such as via an electronic funds transfer, by initiating creation of a paper check that is mailed to the player, or by initiating printing of a voucher at a kiosk in a gaming establishment.

In certain embodiments, the one or more servers include a payment server that handles establishing and cashing out players' account balances and a separate game server configured to determine the outcome and any associated award for a play of a game. In these embodiments, the game server is configured to communicate with the personal gaming device and the payment device, and the personal gaming device and the payment device are not configured to directly communicate with one another. In these embodiments, when the game server receives data representing a request to start a play of a game at a desired wager, the game server sends data representing the desired wager to the payment server. The payment server determines whether the player's account balance can cover the desired wager (i.e., includes a monetary balance at least equal to the desired wager).

If the payment server determines that the player's account balance cannot cover the desired wager, the payment server notifies the game server, which then instructs the personal gaming device to display a suitable notification to the player that the player's account balance is too low to place the desired wager. If the payment server determines that the player's account balance can cover the desired wager, the payment server deducts the desired wager from the account balance and notifies the game server. The game server then determines an outcome and any associated award for the play of the game. The game server notifies the payment server of any nonzero award, and the payment server increases the player's account balance by the nonzero award. The game server sends data representing the outcome and any award to the personal gaming device, which displays the outcome and any award.

In certain embodiments, the one or more servers enable web-based game play using a personal gaming device only if the personal gaming device satisfies one or more jurisdictional requirements. In one embodiment, the one or more servers enable web-based game play using the personal gaming device only if the personal gaming device is located within a designated geographic area (such as within certain state or county lines or within the boundaries of a gaming establishment). In this embodiment, the geolocation module of the personal gaming device determines the location of the personal gaming device and sends the location to the one or more servers, which determine whether the personal gaming device is located within the designated geographic area. In various embodiments, the one or more servers enable non-monetary wager-based game play if the personal gaming device is located outside of the designated geographic area.

In various embodiments, the gaming system includes an EGM configured to communicate with a personal gaming device—such as a smartphone, a tablet computer, a desktop computer, or a laptop computer—to enable tethered mobile game play using the personal gaming device. Generally, in these embodiments, the EGM establishes communication with the personal gaming device and enables the player to play games on the EGM remotely via the personal gaming device. In certain embodiments, the gaming system includes a geo-fence system that enables tethered game play within a particular geographic area but not outside of that geographic area. Examples of tethering an EGM to a personal gaming device and geo-fencing are described in U.S. Patent Appl. Pub. No. 2013/0267324, entitled "Remote Gaming Method Allowing Temporary Inactivation Without Terminating Playing Session Due to Game Inactivity".

Social Network Integration

In certain embodiments, the gaming system is configured to communicate with a social network server that hosts or partially hosts a social networking website via a data network (such as the Internet) to integrate a player's gaming experience with the player's social networking account. This enables the gaming system to send certain information to the social network server that the social network server can use to create content (such as text, an image, and/or a video) and post it to the player's wall, newsfeed, or similar area of the social networking website accessible by the player's connections (and in certain cases the public) such that the player's connections can view that information. This also enables the gaming system to receive certain information from the social network server, such as the player's likes or dislikes or the player's list of connections. In certain embodiments, the gaming system enables the player to link the player's player account to the player's social networking account(s). This enables the gaming system to, once it identifies the player and initiates a gaming session (such as via the player logging in to a website (or an application) on the player's personal gaming device or via the player inserting the player's player tracking card into an EGM), link that gaming session to the player's social networking account(s). In other embodiments, the gaming system enables the player to link the player's social networking account(s) to individual gaming sessions when desired by providing the required login information.

For instance, in one embodiment, if a player wins a particular award (e.g., a progressive award or a jackpot award) or an award that exceeds a certain threshold (e.g., an award exceeding $1,000), the gaming system sends information about the award to the social network server to enable the server to create associated content (such as a screenshot of the outcome and associated award) and to post that content to the player's wall (or other suitable area) of the social networking website for the player's connections to see (and to entice them to play). In another embodiment, if a player joins a multiplayer game and there is another seat available, the gaming system sends that information to the social network sever to enable the server to create associated content (such as text indicating a vacancy for that particular game) and to post that content to the player's wall (or other suitable area) of the social networking website for the player's connections to see (and to entice them to fill the vacancy). In another embodiment, if the player consents, the gaming system sends advertisement information or offer information to the social network server to enable the social network server to create associated content (such as text or an image reflecting an advertisement and/or an offer) and to post that content to the player's wall (or other suitable area) of the social networking website for the player's connections to see. In another embodiment, the gaming system enables the player to recommend a game to the player's connections by posting a recommendation to the player's wall (or other suitable area) of the social networking website.

Differentiating Certain Gaming Systems from General Purpose Computing Devices

Certain of the gaming systems described herein, such as EGMs located in a casino or another gaming establishment, include certain components and/or are configured to operate in certain manners that differentiate these systems from general purpose computing devices, i.e., certain personal gaming devices such as desktop computers and laptop computers.

For instance, EGMs are highly regulated to ensure fairness and, in many cases, EGMs are configured to award monetary awards up to multiple millions of dollars. To satisfy security and regulatory requirements in a gaming environment, hardware and/or software architectures are implemented in EGMs that differ significantly from those of general purpose computing devices. For purposes of illustration, a description of EGMs relative to general purpose computing devices and some examples of these additional (or different) hardware and/or software architectures found in EGMs are described below.

At first glance, one might think that adapting general purpose computing device technologies to the gaming industry and EGMs would be a simple proposition because both general purpose computing devices and EGMs employ processors that control a variety of devices. However, due to at least: (1) the regulatory requirements placed on EGMs, (2) the harsh environment in which EGMs operate, (3) security requirements, and (4) fault tolerance requirements, adapting general purpose computing device technologies to EGMs can be quite difficult. Further, techniques and methods for solving a problem in the general purpose computing device industry, such as device compatibility and connectivity issues, might not be adequate in the gaming industry. For instance, a fault or a weakness tolerated in a general purpose computing device, such as security holes in software or frequent crashes, is not tolerated in an EGM because in an EGM these faults can lead to a direct loss of funds from the EGM, such as stolen cash or loss of revenue when the EGM is not operating properly or when the random outcome determination is manipulated.

Certain differences between general purpose computing devices and EGMs are described below. A first difference between EGMs and general purpose computing devices is that EGMs are state-based systems. A state-based system stores and maintains its current state in a non-volatile memory such that, in the event of a power failure or other malfunction, the state-based system can return to that state when the power is restored or the malfunction is remedied. For instance, for a state-based EGM, if the EGM displays an award for a game of chance but the power to the EGM fails before the EGM provides the award to the player, the EGM stores the pre-power failure state in a non-volatile memory, returns to that state upon restoration of power, and provides the award to the player. This requirement affects the software and hardware design on EGMs. General purpose computing devices are not state-based machines, and a majority of data is usually lost when a malfunction occurs on a general purpose computing device.

A second difference between EGMs and general purpose computing devices is that, for regulatory purposes, the software on the EGM utilized to operate the EGM has been designed to be static and monolithic to prevent cheating by the operator of the EGM. For instance, one solution that has been employed in the gaming industry to prevent cheating and to satisfy regulatory requirements has been to manufacture an EGM that can use a proprietary processor running instructions to provide the game of chance from an EPROM or other form of non-volatile memory. The coding instructions on the EPROM are static (non-changeable) and must be approved by a gaming regulators in a particular jurisdiction and installed in the presence of a person representing the gaming jurisdiction. Any changes to any part of the software required to generate the game of chance, such as adding a new device driver used to operate a device during generation of the game of chance, can require burning a new EPROM approved by the gaming jurisdiction and reinstalling the new EPROM on the EGM in the presence of a gaming regulator. Regardless of whether the EPROM solution is used, to gain approval in most gaming jurisdictions, an EGM must demonstrate sufficient safeguards that prevent an operator or a player of an EGM from manipulating the EGM's hardware and software in a manner that gives him an unfair, and in some cases illegal, advantage.

A third difference between EGMs and general purpose computing devices is authentication—EGMs storing code are configured to authenticate the code to determine if the code is unaltered before executing the code. If the code has been altered, the EGM prevents the code from being executed. The code authentication requirements in the gaming industry affect both hardware and software designs on EGMs. Certain EGMs use hash functions to authenticate code. For instance, one EGM stores game program code, a hash function, and an authentication hash (which may be encrypted). Before executing the game program code, the EGM hashes the game program code using the hash function to obtain a result hash and compares the result hash to the authentication hash. If the result hash matches the authentication hash, the EGM determines that the game program code is valid and executes the game program code. If the result hash does not match the authentication hash, the EGM determines that the game program code has been altered (i.e., may have been tampered with) and prevents execution of the game program code. Examples of EGM code authentication are described in U.S. Pat. No. 6,962,530, entitled "Authentication in a Secure Computerized Gaming System"; U.S. Pat. No. 7,043,641, entitled "Encryption in a Secure Computerized Gaming System"; U.S. Pat. No. 7,201,662, entitled "Method and Apparatus for Software Authentication"; and U.S. Pat. No. 8,627,097, entitled "System and Method Enabling Parallel Processing of Hash Functions Using Authentication Checkpoint Hashes".

A fourth difference between EGMs and general purpose computing devices is that EGMs have unique peripheral device requirements that differ from those of a general purpose computing device, such as peripheral device security requirements not usually addressed by general purpose computing devices. For instance, monetary devices, such as coin dispensers, bill validators, and ticket printers and computing devices that are used to govern the input and output of cash or other items having monetary value (such as tickets) to and from an EGM have security requirements that are not typically addressed in general purpose computing devices. Therefore, many general purpose computing device techniques and methods developed to facilitate device connectivity and device compatibility do not address the emphasis placed on security in the gaming industry.

To address some of the issues described above, a number of hardware/software components and architectures are utilized in EGMs that are not typically found in general purpose computing devices. These hardware/software components and architectures, as described below in more detail, include but are not limited to watchdog timers, voltage monitoring systems, state-based software architecture and supporting hardware, specialized communication interfaces, security monitoring, and trusted memory.

Certain EGMs use a watchdog timer to provide a software failure detection mechanism. In a normally-operating EGM, the operating software periodically accesses control registers in the watchdog timer subsystem to "re-trigger" the watchdog. Should the operating software fail to access the control registers within a preset timeframe, the watchdog timer will timeout and generate a system reset. Typical watchdog timer circuits include a loadable timeout counter register to enable the operating software to set the timeout interval within a certain range of time. A differentiating feature of some circuits is that the operating software cannot completely disable the function of the watchdog timer. In other words, the watchdog timer always functions from the time power is applied to the board.

Certain EGMs use several power supply voltages to operate portions of the computer circuitry. These can be generated in a central power supply or locally on the computer board. If any of these voltages falls out of the tolerance limits of the circuitry they power, unpredictable operation of the EGM may result. Though most modern general purpose computing devices include voltage monitoring circuitry, these types of circuits only report voltage status to the operating software. Out of tolerance voltages can cause software malfunction, creating a potential uncontrolled condition in the general purpose computing device. Certain EGMs have power supplies with relatively tighter voltage margins than that required by the operating circuitry. In addition, the voltage monitoring circuitry implemented in certain EGMs typically has two thresholds of control. The first threshold generates a software event that can be detected by the operating software and an error condition then generated. This threshold is triggered when a power supply voltage falls out of the tolerance range of the power supply, but is still within the operating range of the circuitry. The second threshold is set when a power supply voltage falls out of the operating tolerance of the circuitry. In this case, the circuitry generates a reset, halting operation of the EGM.

As described above, certain EGMs are state-based machines. Different functions of the game provided by the EGM (e.g., bet, play, result, points in the graphical presentation, etc.) may be defined as a state. When the EGM moves a game from one state to another, the EGM stores critical data regarding the game software in a custom non-volatile memory subsystem. This ensures that the player's wager and credits are preserved and to minimize potential disputes in the event of a malfunction on the EGM. In general, the EGM does not advance from a first state to a second state until critical information that enables the first state to be reconstructed has been stored. This feature enables the EGM to recover operation to the current state of play in the event of a malfunction, loss of power, etc. that occurred just before the malfunction. In at least one embodiment, the EGM is configured to store such critical information using atomic transactions.

Generally, an atomic operation in computer science refers to a set of operations that can be combined so that they appear to the rest of the system to be a single operation with only two possible outcomes: success or failure. As related to data storage, an atomic transaction may be characterized as series of database operations which either all occur, or all do not occur. A guarantee of atomicity prevents updates to the database occurring only partially, which can result in data corruption.

To ensure the success of atomic transactions relating to critical information to be stored in the EGM memory before a failure event (e.g., malfunction, loss of power, etc.), memory that includes one or more of the following criteria be used: direct memory access capability; data read/write capability which meets or exceeds minimum read/write access characteristics (such as at least 5.08 Mbytes/sec (Read) and/or at least 38.0 Mbytes/sec (Write)). Memory devices that meet or exceed the above criteria may be referred to as "fault-tolerant" memory devices.

Typically, battery-backed RAM devices may be configured to function as fault-tolerant devices according to the above criteria, whereas flash RAM and/or disk drive memory are typically not configurable to function as fault-tolerant devices according to the above criteria. Accordingly, battery-backed RAM devices are typically used to preserve EGM critical data, although other types of non-volatile memory devices may be employed. These memory devices are typically not used in typical general purpose computing devices.

Thus, in at least one embodiment, the EGM is configured to store critical information in fault-tolerant memory (e.g., battery-backed RAM devices) using atomic transactions. Further, in at least one embodiment, the fault-tolerant memory is able to successfully complete all desired atomic transactions (e.g., relating to the storage of EGM critical information) within a time period of 200 milliseconds or less. In at least one embodiment, the time period of 200 milliseconds represents a maximum amount of time for which sufficient power may be available to the various EGM components after a power outage event has occurred at the EGM.

As described previously, the EGM may not advance from a first state to a second state until critical information that enables the first state to be reconstructed has been atomically stored. After the state of the EGM is restored during the play of a game of chance, game play may resume and the game may be completed in a manner that is no different than if the malfunction had not occurred. Thus, for example, when a malfunction occurs during a game of chance, the EGM may be restored to a state in the game of chance just before when the malfunction occurred. The restored state may include metering information and graphical information that was displayed on the EGM in the state before the malfunction. For example, when the malfunction occurs during the play of a card game after the cards have been dealt, the EGM may be restored with the cards that were previously displayed as part of the card game. As another example, a bonus game may be triggered during the play of a game of chance in which a player is required to make a number of selections on a video display screen. When a malfunction has occurred after the player has made one or more selections, the EGM may be restored to a state that shows the graphical presentation just before the malfunction including an indication of selections that have already been made by the player. In general, the EGM may be restored to any state in a plurality of states that occur in the game of chance that occurs while the game of chance is played or to states that occur between the play of a game of chance.

Game history information regarding previous games played such as an amount wagered, the outcome of the game, and the like may also be stored in a non-volatile memory device. The information stored in the non-volatile memory may be detailed enough to reconstruct a portion of the graphical presentation that was previously presented on the EGM and the state of the EGM (e.g., credits) at the time the game of chance was played. The game history information may be utilized in the event of a dispute. For example, a player may decide that in a previous game of chance that they did not receive credit for an award that they believed they won. The game history information may be used to reconstruct the state of the EGM before, during, and/or after the disputed game to demonstrate whether the player was correct or not in the player's assertion. Examples of a state-based EGM, recovery from malfunctions, and game history are described in U.S. Pat. No. 6,804,763, entitled "High Performance Battery Backed RAM Interface"; U.S. Pat. No. 6,863,608, entitled "Frame Capture of Actual Game Play"; U.S. Pat. No. 7,111,141, entitled "Dynamic NV-RAM"; and U.S. Pat. No. 7,384,339, entitled, "Frame Capture of Actual Game Play".

Another feature of EGMs is that they often include unique interfaces, including serial interfaces, to connect to specific subsystems internal and external to the EGM. The serial devices may have electrical interface requirements that differ from the "standard" EIA serial interfaces provided by general purpose computing devices. These interfaces may include, for example, Fiber Optic Serial, optically coupled serial interfaces, current loop style serial interfaces, etc. In addition, to conserve serial interfaces internally in the EGM, serial devices may be connected in a shared, daisy-chain fashion in which multiple peripheral devices are connected to a single serial channel.

The serial interfaces may be used to transmit information using communication protocols that are unique to the gaming industry. For example, IGT's Netplex is a proprietary communication protocol used for serial communication between EGMs. As another example, SAS is a communication protocol used to transmit information, such as metering information, from an EGM to a remote device. Often SAS is used in conjunction with a player tracking system.

Certain EGMs may alternatively be treated as peripheral devices to a casino communication controller and connected in a shared daisy chain fashion to a single serial interface. In both cases, the peripheral devices are assigned device addresses. If so, the serial controller circuitry must implement a method to generate or detect unique device addresses. General purpose computing device serial ports are not able to do this.

Security monitoring circuits detect intrusion into an EGM by monitoring security switches attached to access doors in the EGM cabinet. Access violations result in suspension of game play and can trigger additional security operations to preserve the current state of game play. These circuits also function when power is off by use of a battery backup. In power-off operation, these circuits continue to monitor the access doors of the EGM. When power is restored, the EGM can determine whether any security violations occurred while power was off, e.g., via software for reading status registers. This can trigger event log entries and further data authentication operations by the EGM software.

Trusted memory devices and/or trusted memory sources are included in an EGM to ensure the authenticity of the software that may be stored on less secure memory subsystems, such as mass storage devices. Trusted memory devices and controlling circuitry are typically designed to not enable modification of the code and data stored in the memory device while the memory device is installed in the EGM.

The code and data stored in these devices may include authentication algorithms, random number generators, authentication keys, operating system kernels, etc. The purpose of these trusted memory devices is to provide gaming regulatory authorities a root trusted authority within the computing environment of the EGM that can be tracked and verified as original. This may be accomplished via removal of the trusted memory device from the EGM computer and verification of the secure memory device contents is a separate third party verification device. Once the trusted memory device is verified as authentic, and based on the approval of the verification algorithms included in the trusted device, the EGM is enabled to verify the authenticity of additional code and data that may be located in the gaming computer assembly, such as code and data stored on hard disk drives. Examples of trusted memory devices are described in U.S. Pat. No. 6,685,567, entitled "Process Verification".

In at least one embodiment, at least a portion of the trusted memory devices/sources may correspond to memory that cannot easily be altered (e.g., "unalterable memory") such as EPROMS, PROMS, Bios, Extended Bios, and/or other memory sources that are able to be configured, verified, and/or authenticated (e.g., for authenticity) in a secure and controlled manner.

According to one embodiment, when a trusted information source is in communication with a remote device via a network, the remote device may employ a verification scheme to verify the identity of the trusted information source. For example, the trusted information source and the remote device may exchange information using public and private encryption keys to verify each other's identities. In another embodiment, the remote device and the trusted information source may engage in methods using zero knowledge proofs to authenticate each of their respective identities.

EGMs storing trusted information may utilize apparatuses or methods to detect and prevent tampering. For instance, trusted information stored in a trusted memory device may be encrypted to prevent its misuse. In addition, the trusted memory device may be secured behind a locked door. Further, one or more sensors may be coupled to the memory device to detect tampering with the memory device and provide some record of the tampering. In yet another example, the memory device storing trusted information might be designed to detect tampering attempts and clear or erase itself when an attempt at tampering has been detected. Examples of trusted memory devices/sources are described in U.S. Pat. No. 7,515,718, entitled "Secured Virtual Network in a Gaming Environment".

Mass storage devices used in a general purpose computing devices typically enable code and data to be read from and written to the mass storage device. In a gaming environment, modification of the gaming code stored on a mass storage device is strictly controlled and would only be enabled under specific maintenance type events with electronic and physical enablers required. Though this level of security could be provided by software, EGMs that include mass storage devices include hardware level mass storage data protection circuitry that operates at the circuit level to monitor attempts to modify data on the mass storage device and will generate both software and hardware error triggers should a data modification be attempted without the proper electronic and physical enablers being present. Examples of using a mass storage device are described in U.S. Pat. No. 6,149,522, entitled "Method of Authenticating Game Data Sets in an Electronic Casino Gaming System".

Various changes and modifications to the present embodiments described herein will be apparent to those skilled in the art. Such changes and modifications can be made without departing from the spirit and scope of the present subject matter and without diminishing its intended technical scope. It is therefore intended that such changes and modifications be covered by the appended claims.

The invention claimed is:

1. A gaming system comprising:
   a processor; and
   a memory device that stores a plurality of instructions that, when executed by the processor, cause the processor to:
   for a first play of a game, cause a display, by a display device, of a first quantity of symbols at a first quantity of symbol display positions, wherein the first quantity of symbol display positions are associated with a first quantity of ways to win, and
   responsive to an occurrence of a symbol display position quantity modification event and a modification of the first quantity of symbol display positions to a second, different quantity of symbol display positions that does not cause a termination event to occur, for a second play of the game, cause a display, by the display device, of a second quantity of symbols at the second, different quantity of symbol display positions, wherein the second, different quantity of symbol display positions are associated with a second, different quantity of ways to win.

2. The gaming system of claim 1, wherein the modification of the first quantity of the symbol display positions comprises adding a quantity of symbol display positions.

3. The gaming system of claim 1, wherein the modification of the first quantity of the symbol display positions comprises removing a quantity of symbol display positions.

4. The gaming system of claim 1, wherein the memory device stores a plurality of further instructions that, when executed by the processor responsive to the second, different quantity of symbol display positions causing the termination event to occur, cause the processor to cause a display, by the display device, of an outcome associated with a position of a secondary event zone.

5. The gaming system of claim 4, wherein the outcome comprises a triggering of a secondary event.

6. The gaming system of claim 4, wherein the outcome comprises an activation of a feature associated with the second play of the game.

7. The gaming system of claim 4, wherein the outcome comprises an activation of a feature associated with one of a plurality of positions of the secondary event zone.

8. The gaming system of claim 4, wherein the outcome is associated with an award.

9. The gaming system of claim 1, wherein the termination event occurs responsive to the second, different quantity of symbol display positions being at least a designated quantity of symbol display positions.

10. The gaming system of claim 1, wherein the memory device stores a plurality of further instructions that, when executed by the processor responsive to an occurrence of a reset event in association with the second play of the game, cause the processor to cause a display, by the display device and for a third play of the game, of a third quantity of symbols at the first quantity of symbol display positions.

11. The gaming system of claim 1, wherein the first quantity of symbol display positions are associated with a plurality of reels and the second, different quantity of symbol display positions are associated with the plurality of reels.

12. A gaming system comprising:
a processor; and
a memory device that stores a plurality of instructions that, when executed by the processor, cause the processor to:
for a play of a game, cause a display, by a display device, of a quantity of symbols at a quantity of symbol display positions, and
responsive to an occurrence of a symbol display position quantity modification event and a modification of the quantity of symbol display positions to a different, modified quantity of symbol display positions that causes a termination event to occur, cause a display, by the display device, of an outcome associated with a position of a secondary event zone.

13. The gaming system of claim 12, wherein the modification of the quantity of the symbol display positions comprises adding a quantity of symbol display positions.

14. The gaming system of claim 12, wherein the modification of the quantity of the symbol display positions comprises removing a quantity of symbol display positions.

15. The gaming system of claim 12, wherein the outcome comprises at least one of: a triggering of a secondary event, an activation of a feature associated with the second play of the game, and an activation of a feature associated with one of a plurality of positions of the secondary event zone.

16. The gaming system of claim 12, wherein the outcome is associated with an award.

17. The gaming system of claim 12, wherein the quantity of symbol display positions are associated with a plurality of reels and the different, modified quantity of symbol display positions are associated with the plurality of reels.

18. The gaming system of claim 12, wherein the quantity of symbol display positions for the play of the game are associated with a quantity of ways to win.

19. A gaming system comprising:
a processor; and
a memory device that stores a plurality of instructions that, when executed by the processor, cause the processor to:
responsive to an occurrence of a triggering event, trigger an unlimited free spins game,
responsive to an occurrence of a symbol display position quantity modification event associated with any free spin of the unlimited free spins game, modify a quantity of symbol display positions associated with that free spin game, and
responsive to the modified quantity of symbol display positions associated with any free spin of the unlimited free spins game causing an occurrence of a termination event, terminate the unlimited free spins game.

20. The gaming system of claim 19, wherein the quantity of symbol display positions are associated with a plurality of reels and the modified quantity of symbol display positions are associated with the plurality of reels.

* * * * *